(12) United States Patent
Nagumo

(10) Patent No.: US 6,535,235 B1
(45) Date of Patent: Mar. 18, 2003

(54) DRIVE CIRCUIT AND LED HEAD INCORPORATING THE DRIVE CIRCUIT

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/712,151

(22) Filed: Nov. 15, 2000

(30) Foreign Application Priority Data

Nov. 16, 1999 (JP) .......................................... 11-325265

(51) Int. Cl.[7] .......................... B41J 2/435; H01L 25/00
(52) U.S. Cl. ...................................... 347/237; 327/565
(58) Field of Search ................................ 347/132, 237, 347/238, 247, 130; 327/565, 566, 544, 515; 345/211, 82

(56) References Cited

U.S. PATENT DOCUMENTS 5,138,310 A * 8/1992 Hirane et al. .................. 345/82
5,734,406 A    3/1998 Nakamura et al. ........... 347/132

FOREIGN PATENT DOCUMENTS

JP          06297765       10/1994
JP          2845719        1/1999

* cited by examiner

*Primary Examiner*—Hai Pham
(74) *Attorney, Agent, or Firm*—Rabin & Berdo, P.C

(57) ABSTRACT

A drive circuit drives a plurality of light emitting diodes (LED) in an LED array chip. The drive circuit includes a row of drive transistors that supply drive currents to corresponding LEDs, a control circuit that produces a control voltage for driving the drive devices, and a supply voltage electrode that extends along the row. The control circuit has a reference current transistor through which a predetermined reference current flows in accordance with a control voltage applied to the reference current transistor. The control voltage is also supplied to the individual drive devices to cause the drive currents to flow through the corresponding LEDs in reference to the reference current. The supply voltage electrode supplies a supply voltage to each of the drive transistors such that each drive transistor receives its supply voltage from a nearest location on the supply voltage electrode. The reference transistor receives its supply voltage from a substantially mid point of the supply voltage electrode. Two or more reference current transistor may be used in which case they are disposed in the row such that the devices are arranged in a mirror like image with respect to a middle of the row. The sum of the currents flowing through the reference current generating devices serves as the reference current.

15 Claims, 21 Drawing Sheets

CONVENTION ART

DRIVE CIRCUIT AND LED HEAD INCORPORATING THE DRIVE CIRCUIT

BACKGROUND OF THE INVENTION

1. Field of the Invention

The present invention relates to a drive circuit that selectively cyclically drives a row of LEDs (light emitting diodes) used in an electrophotographic printer, a row of heat-generating resistors used in a thermal printer, and a row of display elements used in a display. The invention also relates to an LED head incorporating the drive circuit.

2. Description of the Related Art

In a conventional electrophotographic printer, the surface of a photoconductive drum is charged to a high voltage. An optical writing means such as a light emitting diode (referred to as LED hereinafter) head illuminates the charged surface of the photoconductive drum to form an electrostatic latent image thereon. The electrostatic latent image is then developed with toner into a toner image. The toner image is transferred to a print medium such as paper. The print medium is then advanced to a fixing unit where the toner image on the print medium is fused into a permanent print.

The LED head includes a large number of LED array chips, each of which includes a row of a plurality of LEDs. The LED array chips are aligned in a direction parallel to the rotational axis of the photoconductive drum such that the LEDs of the LED arrays lie on a straight line and the light dots emitted from the LEDs are focused on the surface of the photoconductive drum.

FIG. 17 illustrates a general layout of the conventional driver IC mounted on a printed wiring board and surrounding electrodes formed on the board (e.g., Japanese Patent Preliminary Publication (KOKAI) No. 6-297765/1994). A plurality of input electrodes 31 are arranged on one of opposed long sides of a rectangular driver IC. Two rows of LED drive electrodes 32 are arranged parallel to each other on the other of the opposed long sides such that electrodes in one row are staggered with those in the other.

The driver IC incorporates the row 31 of input electrodes, a row 33 of shift registers, a row 34 of latch circuits, a row 35 of pre-buffers including AND circuits and inverters, and a row 37 of drive transistors in the form of P-channel MOS transistors, all of which are aligned in this order from the input electrode side to the LED drive electrode side. The rows are parallel to one another and extend in the longitudinal direction of the driver IC.

The shift registers, latches, pre-buffers, and the drive transistors are arranged at substantially the same intervals as the LED drive electrodes 32 in the longitudinal direction of the driver IC 11. All of these circuit components receive their control signals from the input electrode side via wires, not shown.

The LED supply voltage electrode 36 is formed of aluminum and in the shape of a belt having a width W. The LED supply voltage electrode 36 lies between the row of the pre-buffers 35 and the row of the drive transistors 37 and extends in a direction parallel to these rows. The LED supply voltage electrode 36 has a plurality of electrode pads 38a–38c (e.g., three pads shown in FIG. 17) mounted thereon through which the LED supply voltage VDDH is supplied for driving the LEDs.

Each driver IC 11 drives a total of 192 LEDs through electrode pads DO1–DO192. The LED drive supply VDDH is supplied through the electrode pads 38a, 38b, and 38c provided at locations that correspond to the electrode pads DO32, DO96, and DO160, respectively.

FIG. 18 is a cross-sectional view illustrating a printed wiring board on which the aforementioned the row 31 of input electrodes, LED drive electrodes 32, and LED supply voltage electrode 36 are formed. The driver IC is not shown in FIG. 18. The LED drive electrodes 32 are wire-bonded to the LED array, not shown, via the electrode pads DO–DO192 in the form of an aluminum pattern formed on the printed wiring board.

The electrode pads 38a–38c are formed on the LED supply voltage electrode 36. The input electrodes 31 are in the form of an aluminum electrode and electrode pads 38a–38c of the driver IC are connected through bonding wire 40 to electrodes, not shown, on the printed wiring board.

FIG. 19 illustrates a pertinent portion of an equivalent circuit of the driver IC of FIG. 17 and an LED array chip driven by the driver IC.

Referring to FIG. 19, one driver IC drives 192 LEDs fabricated on one LED array chip. Resistors R201–203 represent equivalent resistance values of the bonding wires 40 (FIG. 18) through which the individual LEDs receive the supply voltage. Nodes S1–S192 indicate the locations on the LED supply voltage electrode 36 to which the sources of the drive transistors M1–M192 are connected. Resistors R1–R191 represent the resistance values between adjacent nodes.

The electrode pads 38a, 38b, and 38c on the LED supply voltage electrode 36 of FIG. 17 are arranged near the electrode pads DO32, DO96, and DO160, respectively. Therefore, the resistors R201, R202, and R203 are connected to the sources of drive transistors M32, M96, and M160, respectively, i.e., the nodes S32, S96, and S160.

The drains of the drive transistors M1–M192 are connected to the anodes of the LEDs D1–D192. The gates of the drive transistors M1–M192 are connected to a later described controller, for example, shown in FIG. 20, which generates a predetermined gate-to-source voltage Vcont that sets the value of drive current Io flowing through each of the LEDs (FIG. 20 shows only Io flowing through D1).

The P-channel MOS transistor M0 is a reference transistor that generates a reference current Iref. The reference transistor M0 is aligned with the row of drive transistors M1–M192. The reference transistor M0 is located adjacent the drive transistor M1 and is depicted in solid black (FIG. 17). The resistors R0–R191 are equivalent resistance values between adjacent nodes of the LED supply voltage electrode 36 formed in the shape of a belt having a width W.

The drive currents Io that flow through individual LEDs are determined in reference to the reference current Iref that flows through the reference transistor M0 located at an end of the row of drive transistors M1–M192 (FIG. 17).

FIG. 20 illustrates a part of the control voltage generating circuit that provides the Vcont for driving the drive transistors of FIG. 19.

Each driver IC has a control voltage-generating circuit 20 and 192 pre-buffers G1–G192. FIG. 20 shows the pre-buffer G1 and an associated circuit that includes a latch circuit LT1, a P-channel MOS type drive transistor M1, and a light emitting diode D1. D1 is one of the LEDs D1–D192 of FIG. 19. The drive transistor M1 is one of the transistors M1–M192 of FIG. 19. The pre-buffer G1 includes an AND circuit AD1, a P-channel MOS transistor TP1, and an N-channel MOS transistor TN1.

An OP amplifier 21 generates an output voltage Vcont. A P-channel MOS transistor M0 has the same gate length as 192 drive transistors M1–M192. An inverting input of the OP amplifier 21 receives a reference voltage Vref from an external circuit.

The OP amplifier 21, P-channel MOS transistor M0, and a resistor Rref form a feedback control circuit. The current that flows through the resistor Rref, i.e., through the P-channel MOS transistor M0 is determined by the reference voltage Vref and the resistor Rref if the supply voltage of the P-channel MOS transistor M0 is constant.

FIG. 21 illustrates the aforementioned LED array chips; CHP1–CHP26 aligned along the surface of the photoconductive drum in a direction parallel to the rotational axis of the photoconductive drum, and drive currents Io flowing through the LEDs contained in each of the LED array chips CHP1–CHP26. The LED array chips CHP1–CHP26 are driven by corresponding driver ICs DRV1–DRV26.

Each of the LED array chips CHP1–CHP26 includes 192 LEDs fabricated therein. Each LED is connected by wire bonding to a corresponding electrode pad DO of the LED drive electrode 32 of a corresponding driver IC.

The driver ICs DRV1–DRV26 are connected in cascade so that print data received from an external circuit is serially transferred therethrough. Each of the driver ICs DRV1–DRV26 is capable of driving 192 LEDs.

It is desirable that all of the driver ICs DRV1–DRV26 supply substantially the same drive current Io to all of the LEDs of the corresponding LED array chips. However, the drive current Io vary from LED to LED due to problems encountered during the manufacturing process of semiconductor device. The variation of drive current Io causes variation of the intensity of light emitted from the LEDs. Differences in the intensity of light result in variation of exposure effect when the LED head illuminates the photoconductive drum. This causes the variation of dot-size.

When characters are printed, variation of dot size has negligible effect. However, when an image such as a photograph is printed, the variation of dot size causes the variation of print density, degrading print quality. In order to minimize the variation of dot size, the driver ICs are screened, and selected driver ICs are used so that the drive currents in each LED array chip are within a predetermined range ΔI.

As is clear from FIG. 21, adjacent LEDs have very small differences in drive current. Drive currents supplied to the LEDs in an LED array chip from the same driver IC tend to monotonically increase or decrease along the row of the LEDs.

For this reason, the current that flows through the electrode pad DO1 (i.e., drive transistor M1) serves as a reference with respect to which the drive currents Io of the individual LEDs are set. The control voltage generating circuit 20 in the respective driver IC controls the drive current Io to be constant. Since selected driver ICs are used, the drive current varies within the predetermined range ΔI.

Referring to FIG. 21, it is to be noted that only the leftmost D1 of each LED array chip is supplied with a drive current of I1 but other LEDs in the same LED array chip are supplied with drive currents different from I1.

Thus, the conventional driver ICs suffer from the problem that when a plurality of drive ICs are used to drive a plurality of LED array chips, one particular LED in each LED array chip is supplied with the same current as the corresponding LED in the other LED array chips, but no attempt is made to equalize the drive currents supplied to the other LEDs in the LED array chips. Because the drive currents supplied to the LEDs either monotonically increase or monotonically decrease along the row of the LEDs, the drive current may vary within the range 2ΔI across the entire row of the LED array chips.

SUMMARY OF THE INVENTION

The present invention was made in view of the aforementioned drawbacks.

A drive circuit drives a plurality of LEDs in an LED array chip. The drive circuit includes a row of drive devices (e.g., transistors), a control circuit, and a supply voltage electrode. The control circuit has a reference current generating device (e.g., transistor) and generates a control voltage that causes a predetermined reference current to flow through the reference current generating device. The control voltage is also supplied to the drive devices to cause drive currents to flow through the corresponding elements (i.e., LEDs) in reference to the reference current. The supply voltage electrode extends along the row of drive devices, and supplies a supply voltage to the drive devices such that each of the drive devices receives the supply voltage from a nearest location on the supply voltage electrode. The reference current generating device receives its supply voltage from a substantially mid point of the supply voltage electrode.

Another drive circuit drives a plurality of LEDs in an LED array chip. The drive circuit includes a row of drive devices (e.g., transistors) that supply drive currents to corresponding elements (i.e., LEDs), a control circuit having a plurality of reference current generating devices (e.g., transistors) that cooperate to produce a predetermined reference current, and a supply voltage electrode that extends along the row of drive devices. The control circuit generates a control voltage that controls the plurality of reference current generating devices to produce the predetermined reference current. The control voltage is also supplied to the drive devices to cause the drive currents to flow through the corresponding elements in reference to the reference current. The supply voltage electrode supplies a supply voltage to the drive devices such that each of the drive devices receives its supply voltage from a nearest location on the supply voltage electrode. The plurality of reference current generating devices are aligned with the drive devices such that the reference current generating devices are mirror images of one another with respect to a substantially mid point of the row, and the reference current is a sum of currents flowing through the plurality of reference current generating devices. The plurality of reference current generating devices may include two devices. A first one of the two devices is disposed at a first end of the row and a second one of the two devices is disposed at a second end of the row opposite to the first end. Alternatively, the first one of the two devices may be disposed at a first location in the row and a second one of the two devices may be disposed at a second location in the row.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

The present invention will be described in detail by way of example.

First Embodiment

{Construction}

Figure 1:
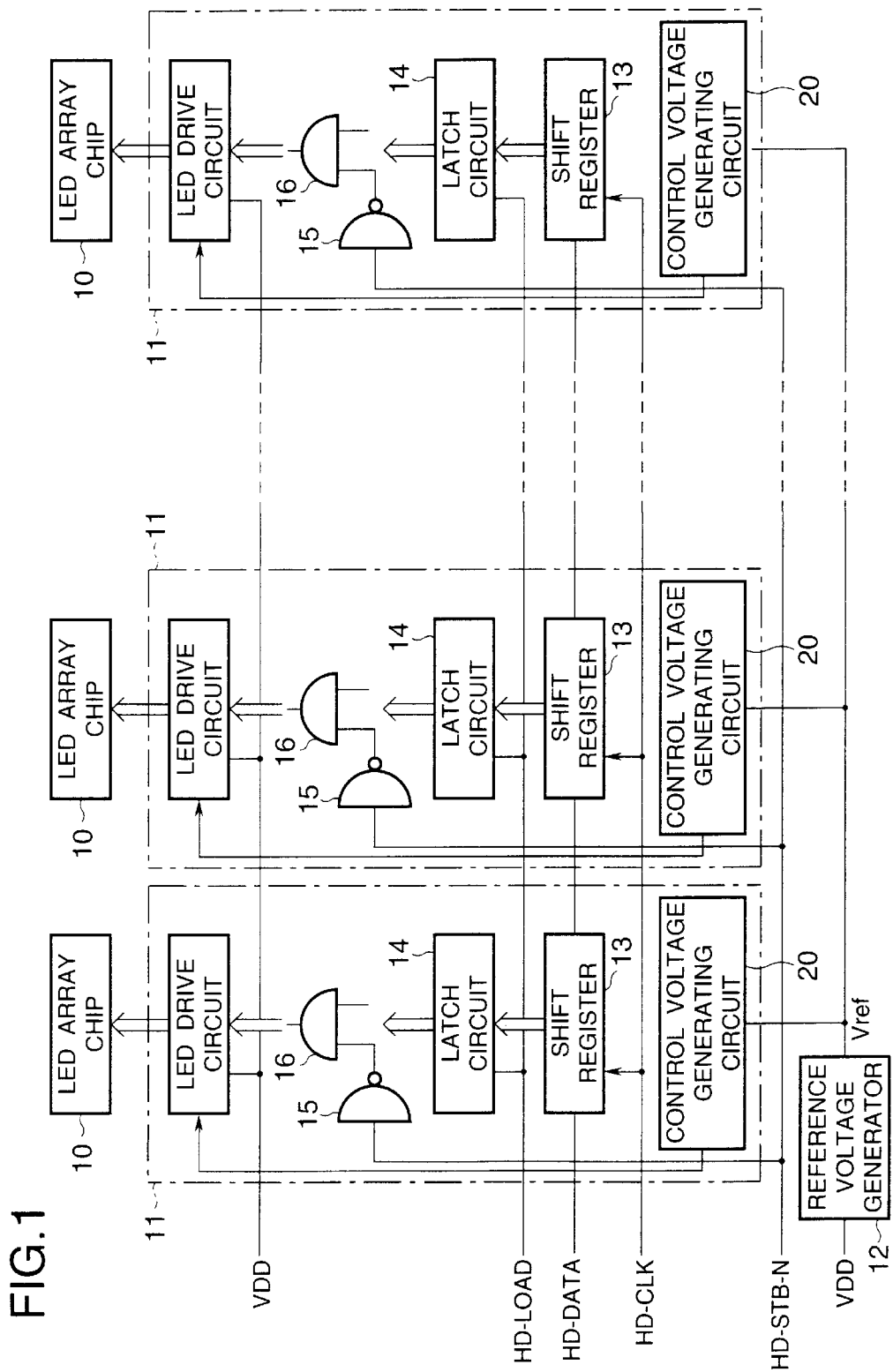
FIG. 1 is a block diagram illustrating a configuration of an LED head according to the present invention.

FIG. 1 is a block diagram illustrating a configuration of an LED head according to the present invention.

Referring to FIG. 1, areas bounded by dot-dash lines are driver ICs 11 that drive LED array chips. The LED head includes a reference voltage generating circuit 12, 26 driver ICs 11, and 26 LED array chips 10. The LED array chips 10 are aligned in a direction parallel to a rotational axis of a photoconductive drum, not shown, along the surface of the drum. Each LED array chip 10 has 192 LEDs driven by corresponding drive transistors fabricated in a corresponding driver IC 11. The driver ICs 11 are connected in cascade parallel to the row of the LED array chips 10.

The driver IC 11 includes a shift register 13, a latch circuit 14, an inverter 15, an AND gate 16, an LED drive circuit 17, and a control voltage generating circuit 20. The shift register 13 includes 192 cascaded flip-flops through which print data (HD-DATA) is shifted from one flop-flop to the next flip-flop upon a clock (HD-CLK). The latch circuit 14 holds the output signal of the shift register 13 upon a latch signal (HD-LOAD). The inverter 15 provides an inverted strobe signal (HD-STB-N) to the AND gate 16 that produces a logical product of the output of the latch circuit 14 and the inverter 15. The LED drive circuit 17 supplies drive currents to individual LEDs in the LED array chip 10 in accordance with the output of the AND gate 16. The control voltage generating circuit 20 generates a control voltage that drives the LED drive circuit 17 to supply a predetermined drive current to individual LEDs.

{Driver IC}

Figure 2:
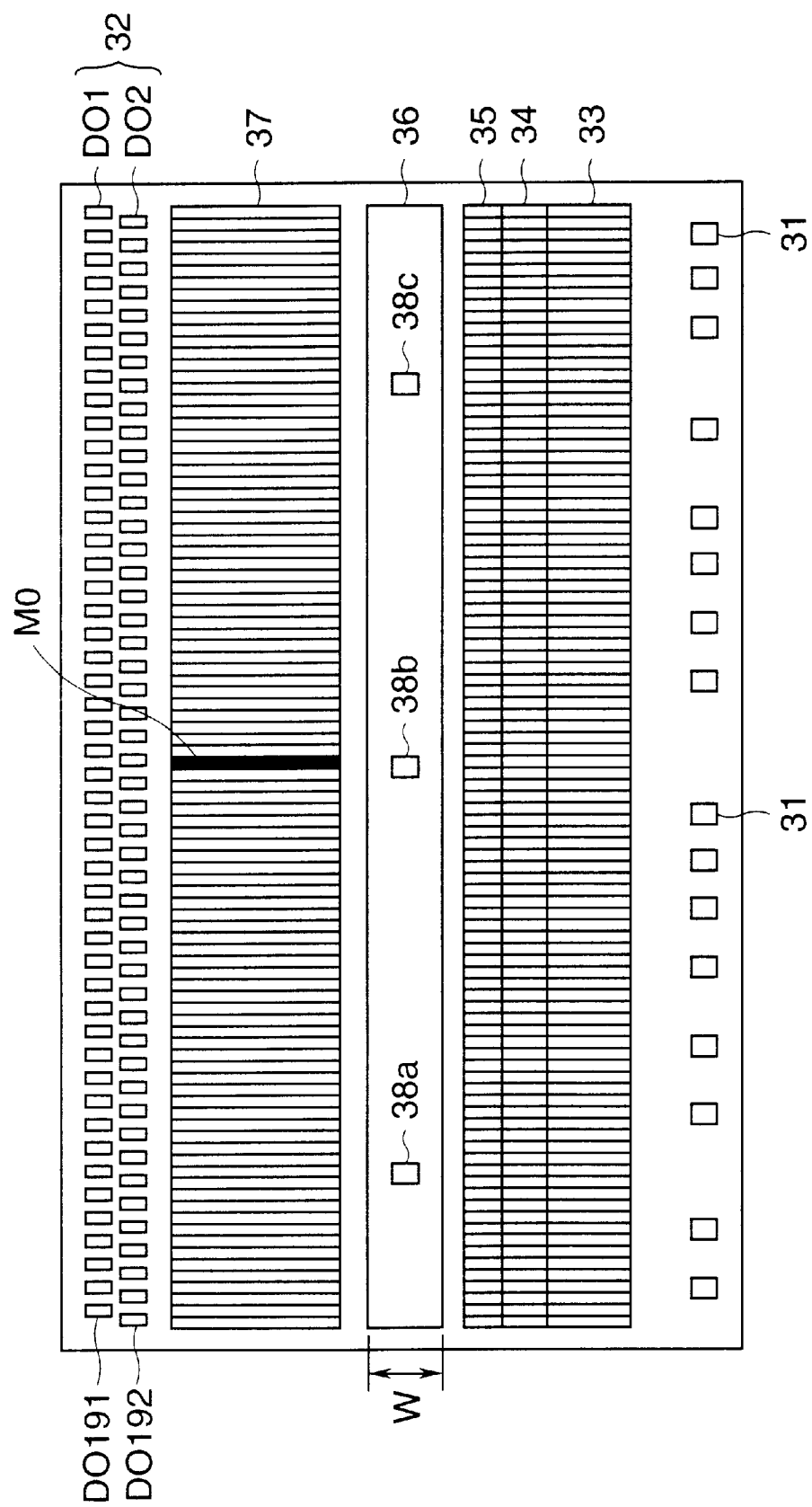
FIG. 2 illustrates an outline of the geometric layout of a driver IC and surrounded electrodes according to a first embodiment.

FIG. 2 illustrates an outline of the geometric layout of a driver IC mounted on a printed wiring board and surrounding electrodes formed on the board according to a first embodiment. The elements similar to those in FIG. 17 have been given the same reference numerals.

Figure 17:
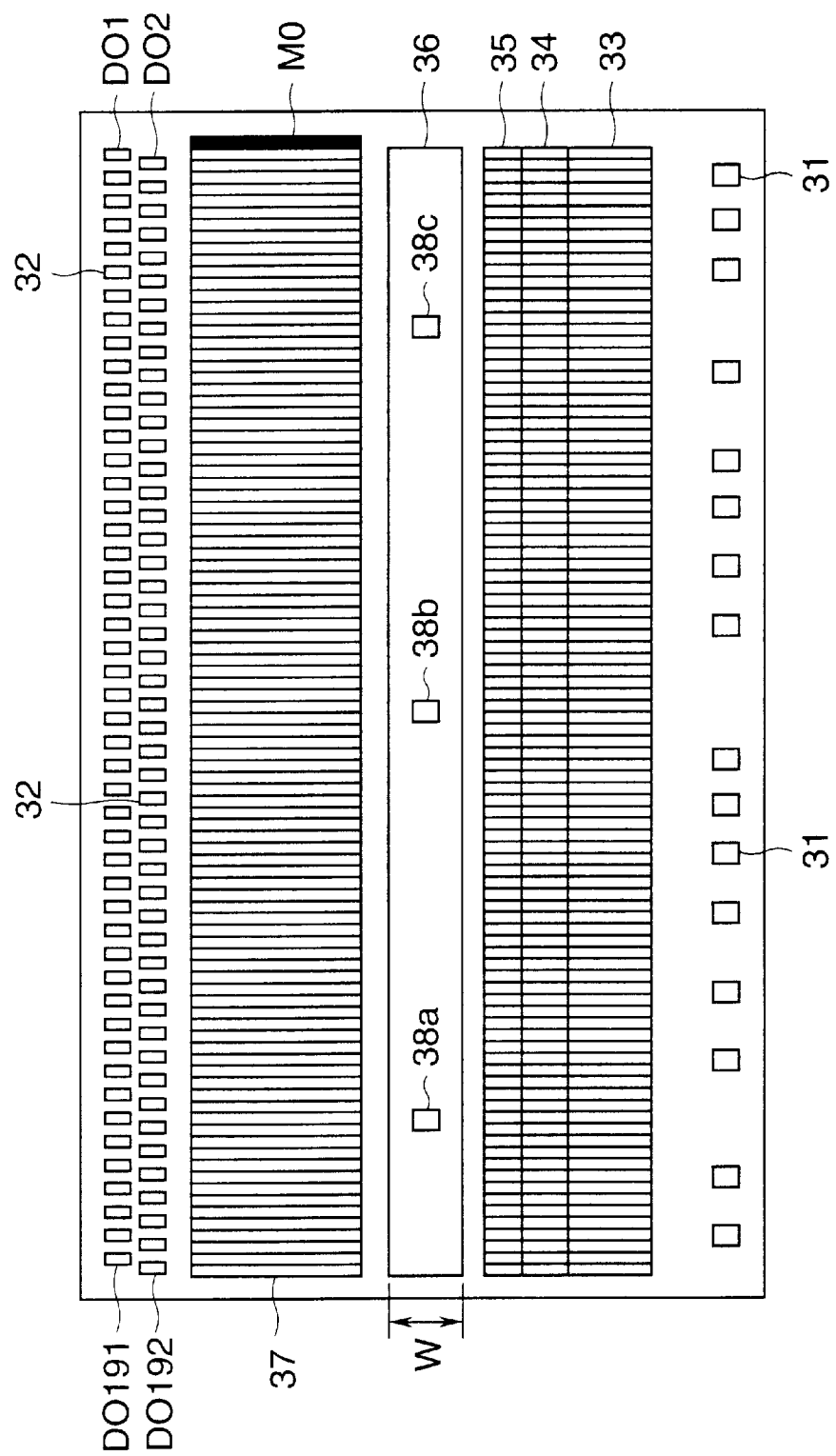
FIG. 17 illustrates a general layout of a conventional LED driver board.
Figure 18:
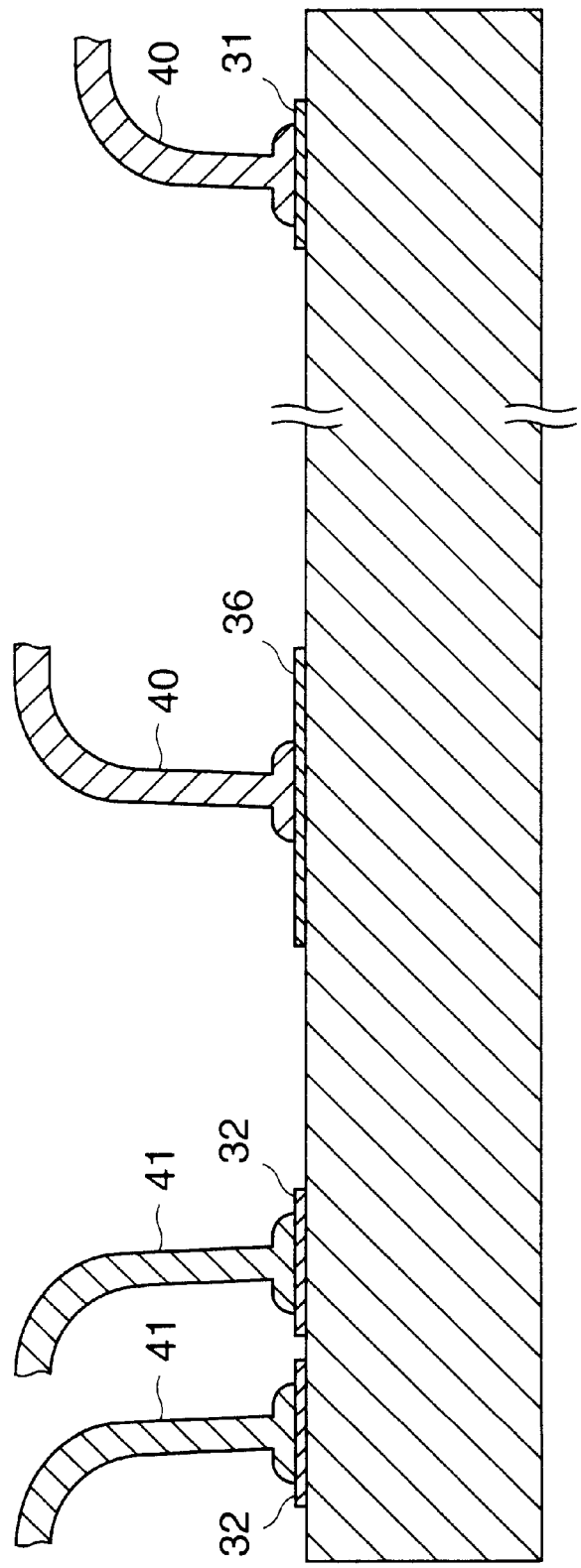
FIG. 18 is a cross-sectional view illustrating a driver IC and a printed wiring board on which the electrodes of FIG. 17 are formed.
Figure 19:
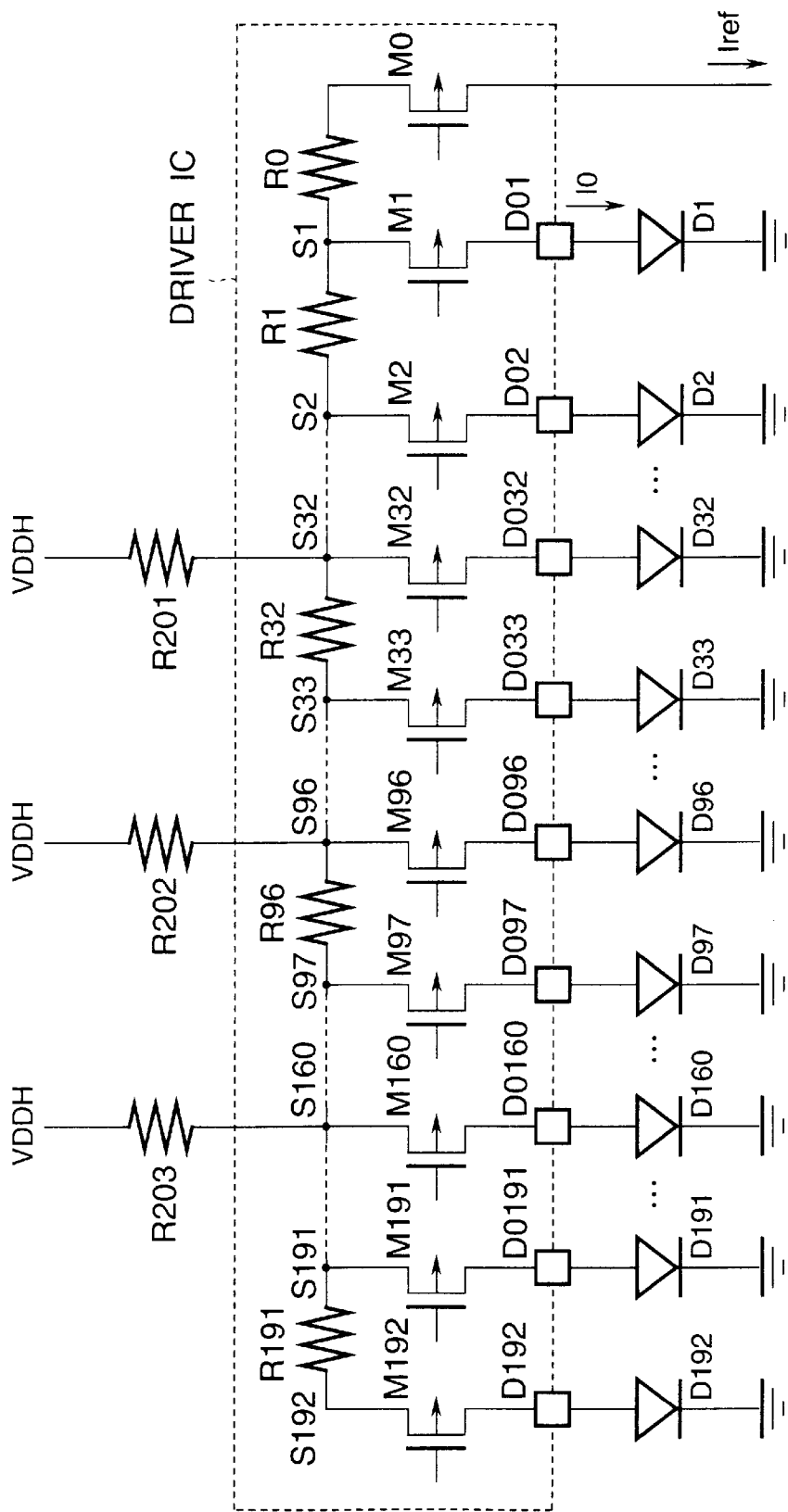
FIG. 19 illustrates a pertinent portion of an equivalent circuit of the driver IC of FIG. 17 and an LED array chip driven by the driver IC.
Figure 20:
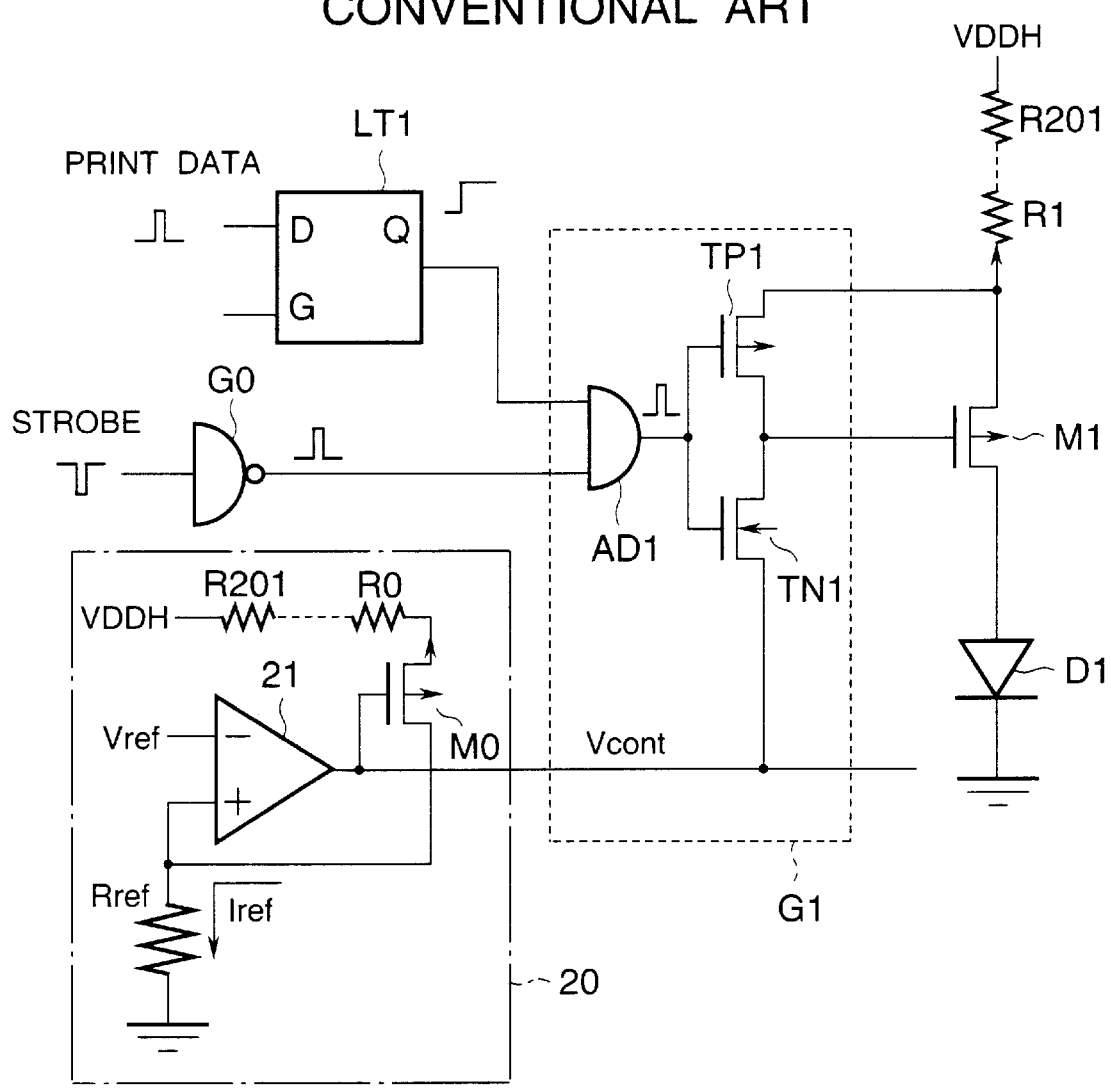
FIG. 20 illustrates a part of the control circuit that generates a control voltage for driving the drive transistors of FIG. 17.
Figure 21:
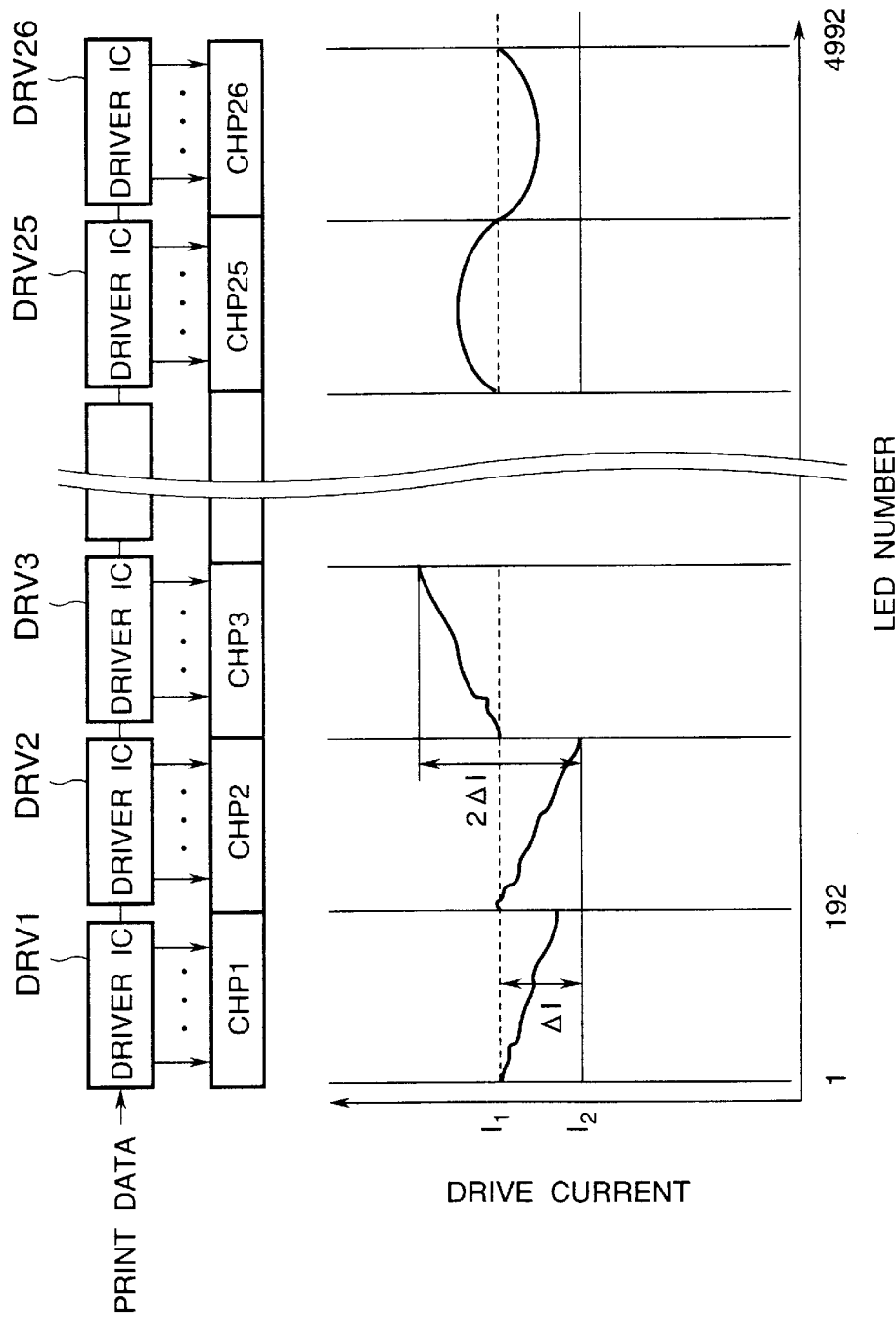
FIG. 21 illustrates LED array chips aligned along the surface of the photoconductive drum in a direction parallel to the rotational axis of the photoconductive drum, and drive currents Io flowing through the LEDs contained in each of the LED array chips.

FIG. 2 differs from FIG. 17 in that a reference transistor M0 is located at a substantially mid point of a row 37 of drive transistors and the reference transistor M0 receives its supply voltage from an LED supply voltage electrode 36 close to the electrode pad DO96. The reference transistor M0 is depicted in solid black.

Figure 3:
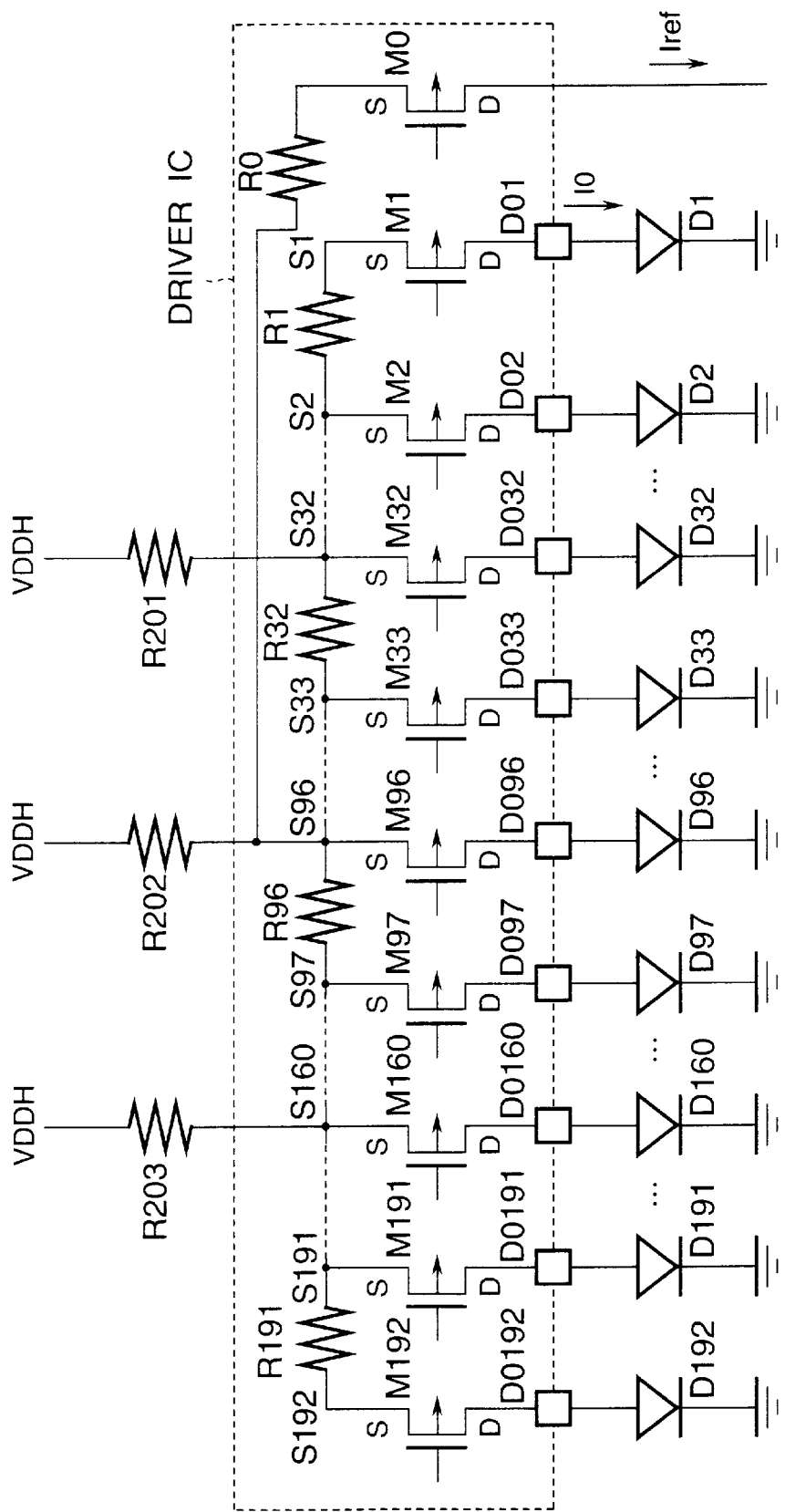
FIG. 3 illustrates a pertinent portion of an equivalent circuit of an LED array and the driver IC (surrounded by dotted lines) of FIG. 2.

FIG. 3 illustrates a pertinent portion of an equivalent circuit of the LED array and driver IC (surrounded by dotted lines) of FIG. 2. FIG. 3 shows a case in which one driver IC drives 192 LEDs.

As mentioned with reference to FIG. 2, the reference transistor M0 receives its supply voltage from a node 96 of the LED supply voltage electrode 36.

Resistors R201–203 are equivalent resistance values of the bonding wires through which the supply voltage is supplied to the LED supply voltage electrode 36.

Nodes S1–S192 indicate locations on the LED supply voltage electrode 36 to which the sources of the drive transistors M1–M192 are connected. Resistors R1–R191 represent equivalent resistance values between adjacent nodes S1–S192 of the LED supply voltage electrode 36 in the shape of a belt having a width W.

Electrode pads 38a, 38b, and 38c mounted on the LED supply voltage electrode 36 of FIG. 2 are positioned near the electrode pads DO32, DO96, and DO160 of the LED drive electrode 32, respectively. Thus, the resistors R201, R202 and R203 are connected to nodes S32, S96 and S160, respectively, i.e., the source terminals of M32, M96 and M160. The drains of the drive transistors M1–M192 are connected to anodes of LEDs D1–D192 via the electrode pads DO1–DO192.

Figure 4:
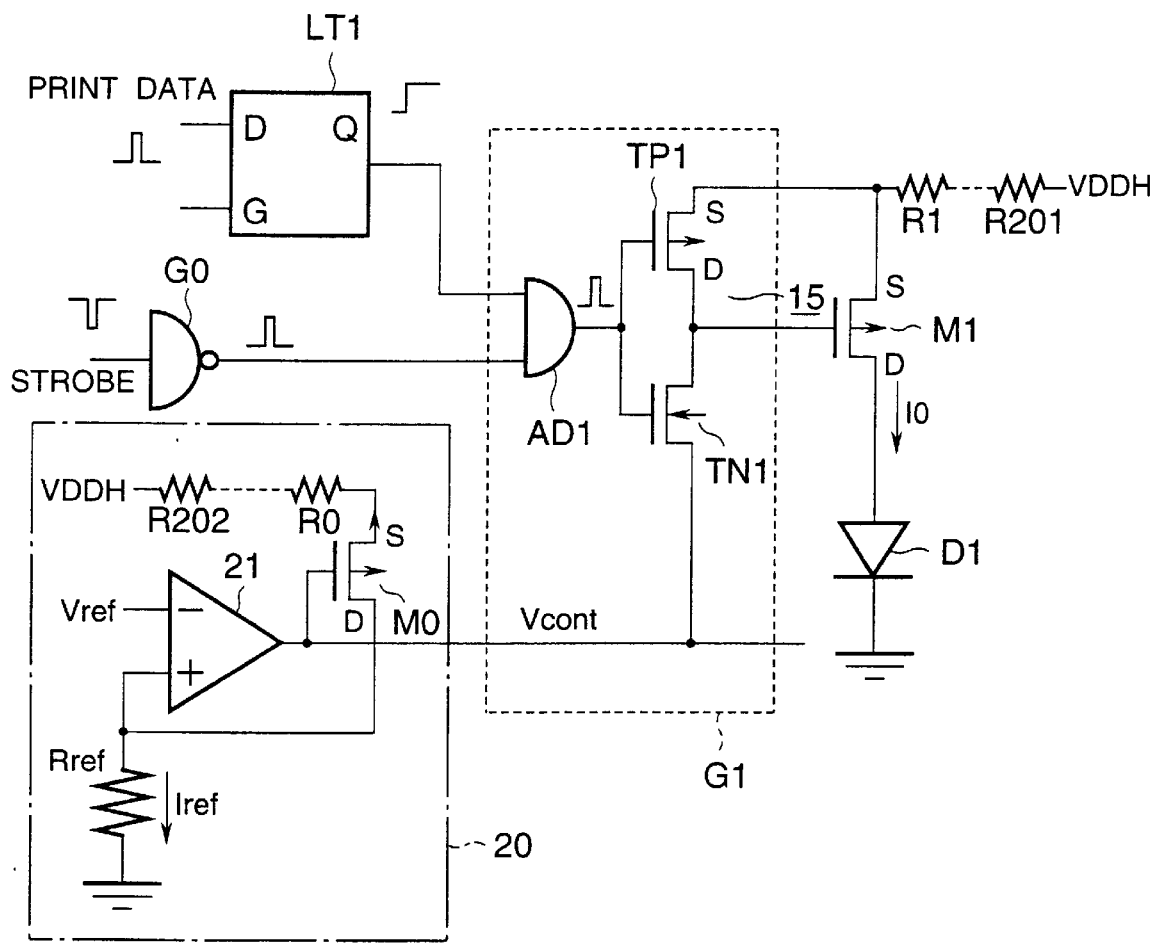
FIG. 4 illustrates the connection between a pre-buffer G1 and fits surrounding circuits of the first embodiment.

FIG. 4 illustrates a control voltage generating circuit and the connection between a pre-buffer G1 and its associated circuit of the first embodiment.

Referring to FIG. 4, the reference transistor M0 is a P-channel MOS transistor and receives its supply voltage from the LED supply electrode near the electrode pad DO96 of the LED drive electrode 32.

An LED D1 of FIG. 4 is one of LEDs D1–D192 of FIG. 3. A drive transistor M1 of FIG. 4 is one of P-channel MOS transistors M1–M192.

The control voltage generating circuit 20 is a feedback control circuit that includes an OP amplifier 21, a P-channel MOS transistor M0, and a resistor Rref. The OP amplifier 21 generates an output voltage Vcont. The P-channel MOS transistor M0 has the same gate length as 192 drive transistors M1–M192. An inverting input of the OP amplifier 21 receives a reference voltage Vref from an external circuit.

The current that flows through the reference transistor M0 is a reference current Iref determined by a reference voltage Vref and resistor Rref. The control voltage generating circuit 20 generates a control voltage Vcont that controls the reference transistor M to produce the reference current Iref.

Each of the gates of the drive transistors M1–M192 is connected to the control voltage generating circuit of FIG. 4. Thus, the control voltage Vcont is also supplied to the gates of the drive transistors M1–M192. The control voltage Vcont determines the value of the drive current Io that flows through each of the drive transistors.

{Operation}

The operation in which the LEDs in the LED array are driven will be described.

We assume that when the print data for an LED is a high level, the LED is to be energized. The print data is transferred through the shift registers (not shown) in the driver IC 11. For this purpose, a print controller generates as many clock signal pulses as required for transferring the dots in one line, and sends the clocks to the LED head.

When data for one line has been transferred, the print controller generates a load signal that causes the latch circuits in the driver IC (not shown) to hold the data contained in the shift registers in the driver IC. Then, the print controller generates a strobe signal that causes the IEDs to be energized.

Referring to FIG. 4, the strobe signal is fed to an inverter Go and a high level is latched into the latch circuit LT1. The inverter G0 outputs a strobe signal with a positive polarity, and the AND circuit AD1 outputs a logical product of the strobe signal and the output of the latch circuit LT1. In other words, the output of the AND circuit AD1 changes from a low level to a high level.

The output of the AND circuit AD1 is then fed to an inverter circuit 15 formed of a P-channel MOS transistor TP1 and an N-channel MOS transistor TN1. The output of the inverter circuit 15 changes from a high level to a low level, i.e., from a high voltage nearly equal to VDDH to a low voltage nearly equal to Vcont. As a result, the gate potential of a P-channel MOS type drive transistor M1 becomes nearly equal to the Vcont so that the drive transistor M1 turns on to output the drive current Io for a corresponding D1.

It is assumed that the drive transistor M1 and the reference transistor M0 has the same gate length L and that the drive transistor M1 has a gate width W and the reference transistor M0 has a gate width Wref.

The two P-channel MOS transistors M1 and M0 have substantially the same gate-to-source voltage Vgs. Thus, the following relationship exists between the drive current Io and the reference current Iref.

$$Io = \beta \times (W/L) \times (Vgs - Vt)^2 \qquad (1)$$

$$Iref = \beta \times (Wref/L) \times (Vgs - Vt)^2 \qquad (2)$$

where Vt is a threshold voltage of a MOS transistor and β is a proportionality constant. If the drive transistor M1 and reference transistor M0 are located adjacent to each other, their threshold voltages Vt and proportionality constants β are substantially the same for Equations (1) and (2).

As is clear from Equations (1) and (2), there exists the following relation.

$$Io/Iref = W/Wref = K \qquad (3)$$

where K is a mirror ratio. The mirror ratio is preferably 1.

Referring to FIG. 2, the reference transistor M0 that generates the reference current Iref is located in the longitudinal direction. in the middle of the driver IC. Therefore, even if the proportionality constant β and the threshold voltage Vt vary depending on locations within the chip of the driver IC, it is expected that a median value of drive currents Io is substantially the same as the drive current supplied from a transistor located at a substantially mid point of the row of the drive transistors.

In the first embodiment, the reference current Iref is determined by the reference transistor M0 located in the middle of the row of the drive transistors M1–M192.

Figure 5:
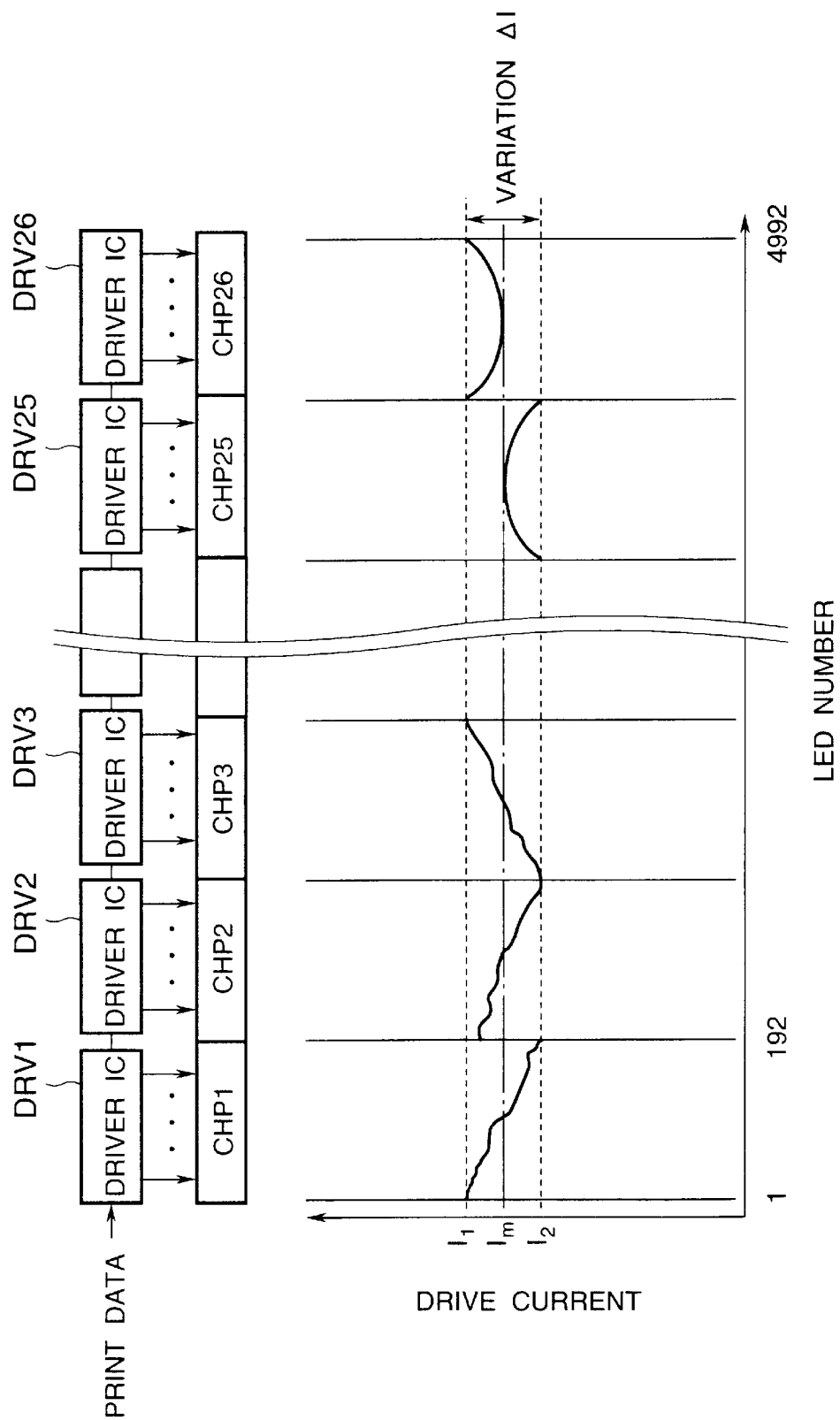
FIG. 5 illustrates LED array chips that are driven by driver ICs according to the first embodiment and drive currents that flow through the LEDs fabricated in each of the LED array chip.

FIG. 5 illustrates LED array chips CHP1–CHP26 that are driven by driver IC DRV1–DRV26 according to the first embodiment and drive currents that flow through the LEDs fabricated in each of the LED array chip. The LED array chips CHP1–CHP26 are aligned in a direction parallel to the rotational axis of the photoconductive drum along the surface of the photoconductive drum. The LED array chips CHP1–CHP26 are driven by corresponding driver ICs DRV1–DRV26.

Despite the fact that the drive current Io varies from LED to LED due to the variation of the threshold voltage Vt of the drive transistor, FIG. 5 reveals that the driver ICs DRV1–DRV26 have substantially the same median value of the drive currents that flow through the drive transistors. In addition, the drive currents supplied by all of the driver ICs are within the same range ΔI. As a result, the drive current varies within substantially the same range for all driver ICs.

The drive circuit according to the first embodiment reduces the variation of drive current by a factor of 2, i.e., from 2ΔI to ΔI as compared to the conventional art.

Second Embodiment

In FIGS. 6–9, elements similar to those of the first embodiment have been given the same reference numerals and the description thereof is omitted.

Figure 6:
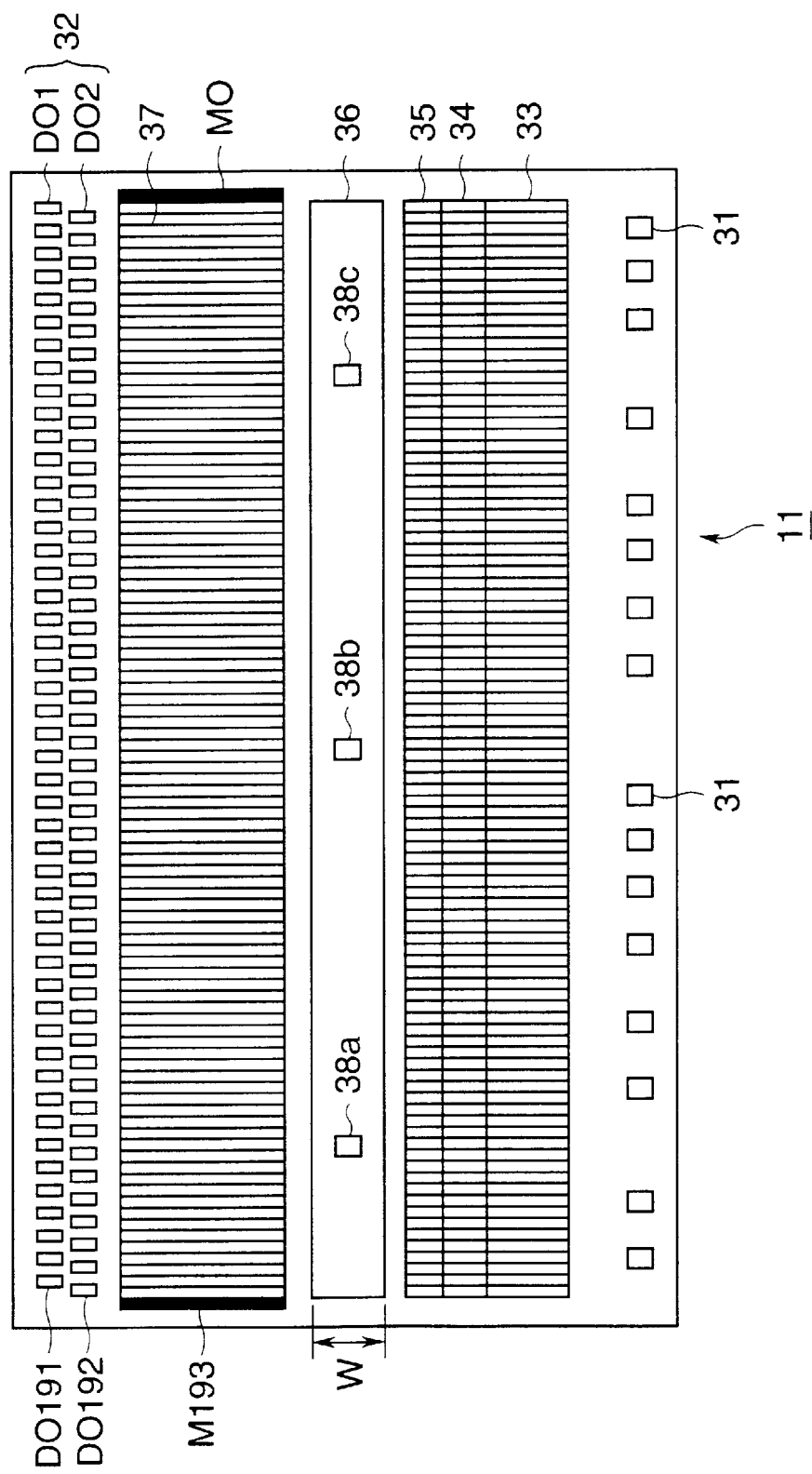
FIG. 6 illustrates a general layout of a driver IC and surrounded electrodes according to a second embodiment.

FIG. 6 illustrates a general layout of a driver IC mounted on on a printed wiring board and surrounding electrode formed on the board according to a second embodiment.

FIG. 6 differs from FIG. 2 in that the control voltage generating circuit 20 includes two reference transistors M0 and M193 are disposed such that the two reference transistors M0 and M193 are mirror images of each other with respect to a mid point of the row of the drive transistors M1–M192. In other words, the reference transistors M0 and M193 are positioned at opposed longitudinal ends of the row of the drive transistors. The two reference transistors M0 and M193 are depicted in solid black.

Figure 7:
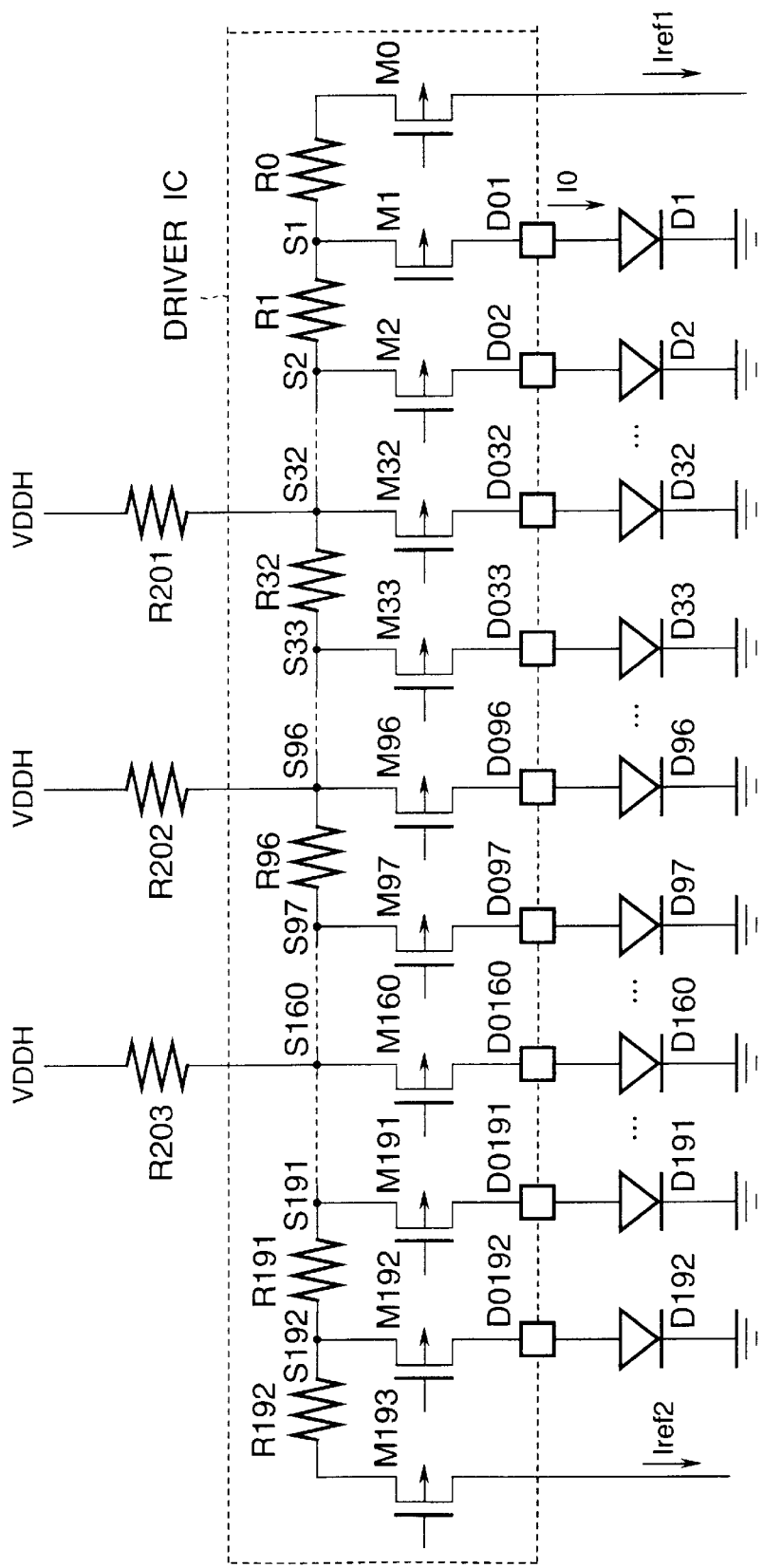
FIG. 7 illustrates a pertinent portion of an equivalent circuit of the LED array and the driver IC of FIG. 6.

FIG. 7 illustrates a pertinent portion of an equivalent circuit of the LED array and driver IC of FIG. 6. The sources of the two reference transistors M0 and M193 are connected to the nodes S1 and S192, respectively. Currents Iref1 and Iref2 are the drain currents of the reference transistors M0 and M193, respectively.

Figure 8:
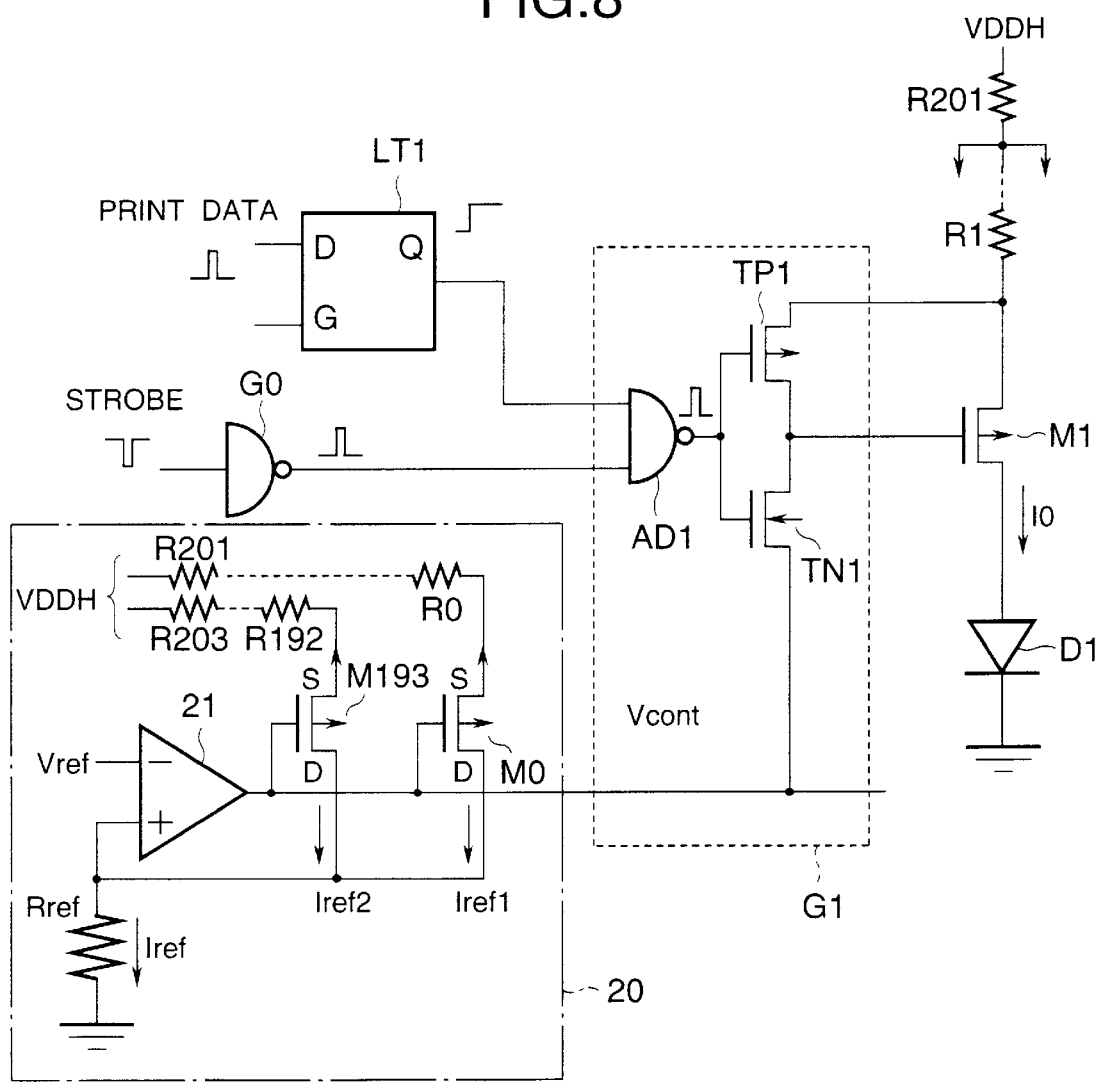
FIG. 8 illustrates the connection between the pre-buffer G1 and associated circuits according to the second embodiment.

FIG. 8 illustrates the connection between the pre-buffer G1 and the associated circuits according to the second embodiment.

FIG. 8 differs from FIG. 4 in that two reference transistors M0 and M193 are connected in parallel. The reference current Iref is a sum of the drain currents Iref1 and Iref2 of the reference transistors M0 and M193, respectively.

The reference transistors M0 and M193 used in the second embodiment have the same gate length as the reference transistor M0 in the first embodiment but have a gate width that is half that of the first embodiment. Thus, there exists a relationship as shown by Equation (4).

$$Iref = Iref1 + Iref2 \quad (4)$$

In an ideal case where the two transistors M0 and M193 are identical with each other and therefore there is no significant difference in drive current, the relationship as shown by Equation (5) exists.

$$Iref1 = Iref2 = Iref/2 \quad (5)$$

The operation of driving LEDs D1–D192 of the LED arrays will be described.

The reference current Iref is the sum of the drain currents Iref1 and Iref2 of the two reference transistors M0 and M193, respectively, located at opposed longitudinal ends of the row of drive transistors. The gate-to-source voltage determines the drain currents Iref1 and Iref2 and serves as a control voltage Vcont. The control voltage Vcont is applied to each drive transistor that drives a corresponding LED.

Figure 9:
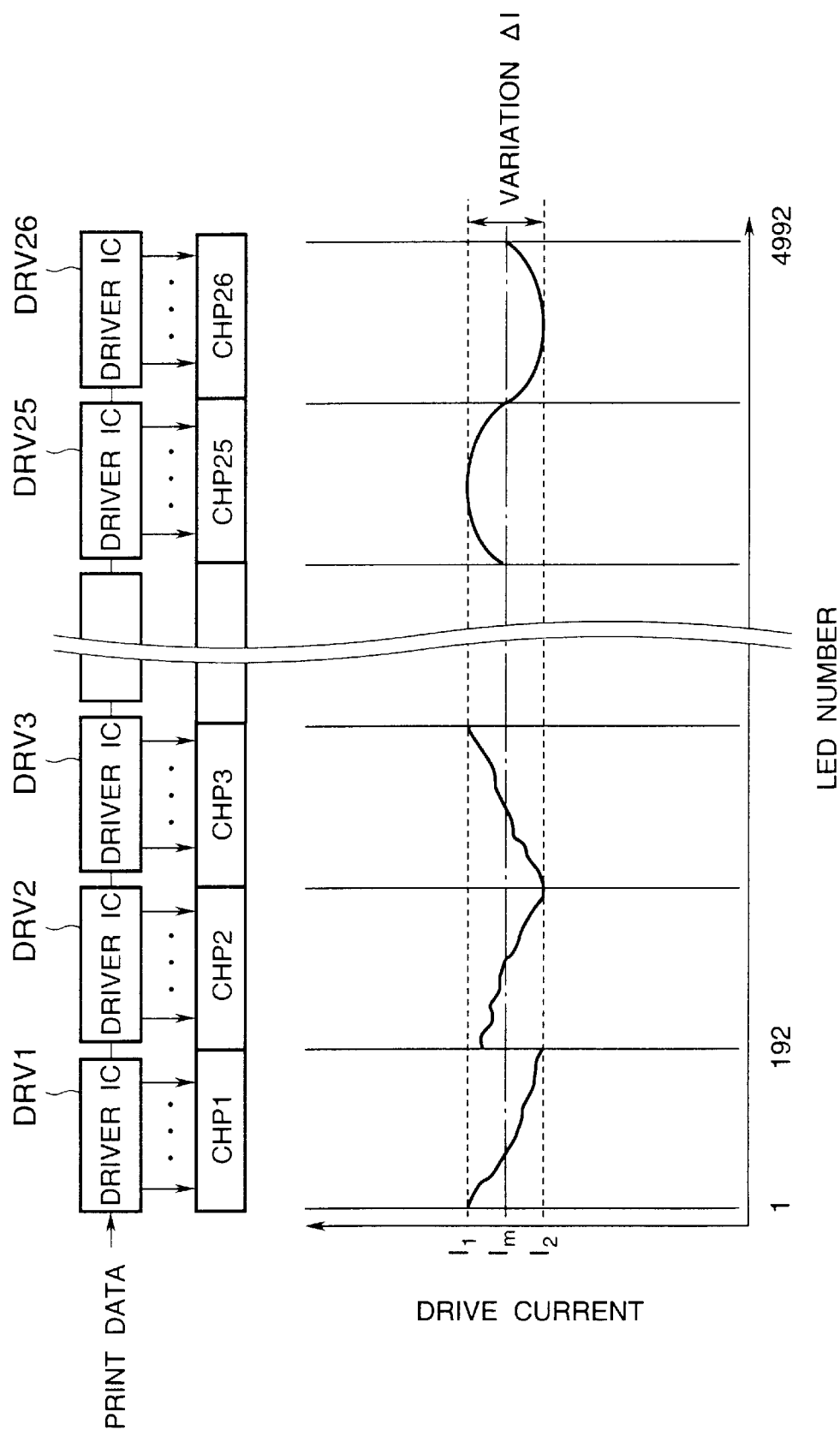
FIG. 9 illustrates LED array chips that are driven by driver ICs according to the second embodiment, and drive currents that flow through the LEDs fabricated in the LED array chips.

FIG. 9 illustrates LED array chips CHP1–CHP26 of the LED head aligned parallel to the rotational axis of the photoconductive drum along the surface of the photoconductive drum, and drive currents flowing through the LEDs fabricated in the LED array chips CHP1–CHP26. The LED array chips CHP1–CHP26 are driven by corresponding driver ICs DRV1–DRV26.

For example, the reference transistor M0 and the adjacent drive transistor M1 have substantially the same gate length and the ratio of their gate widths is a predetermined value such that the so-called mirror ratio K is constant. The two transistors M1 and M0 are arranged side by side on the driver IC such that their transistor characteristics are substantially the same and therefore they are subjected to substantially the same temperature.

In FIG. 9, the driver IC supplies a drive current I1 to the LED D1 of the LED chip CHP1 and a drive current I2 to the LED D192. It should be noted that the drain current of the drive transistor M1 is in a certain relation with that of the reference transistor M0, i.e., they differ by a mirror ratio K. The aforementioned relation between the reference transistor M0 and M1 also exists between, for example, the drive transistor M192 and the reference transistor M193. Therefore, the following Equations (6) and (7) exist between the current I1 flowing through the LED D1 and the I2 flowing through the LED D192 in FIG. 9.

$$I1 = K \times Iref1 \quad (6)$$

$$I2 = K \times Iref2 \quad (7)$$

Thus, an average value of the currents I1 and I2 that flow at the opposed longitudinal ends of the driver IC 11 is given by Equation (8).

$$(I1+I2)/2 \approx K \times (Iref1+Iref2)/2 = K \times Iref/2 \quad (8)$$

Even when the drive currents supplied from the driver IC to individual LEDs vary within the range of ΔI, the reference value of the drive current supplied from the driver IC is substantially equal to an average value of the drain currents Iref1 and Iref2 that flow through the reference transistor M193 and the drive transistor M193, respectively, arranged at two opposed longitudinal ends of the driver IC. Accordingly, it can be assumed that a mean value Im of the drive currents is substantially at the center of ΔI.

In addition to the advantages offered by the first embodiment, the second embodiment provides the following advantage. That is, even when the drive currents of individual LEDs are not monotonically increasing or decreasing along the row of the LEDs in each LED array chip, the variation of drive current between adjacent chips of driver IC can be reduced. Thus, difference in print density among dots is decreased.

Third Embodiment

Figure 10:
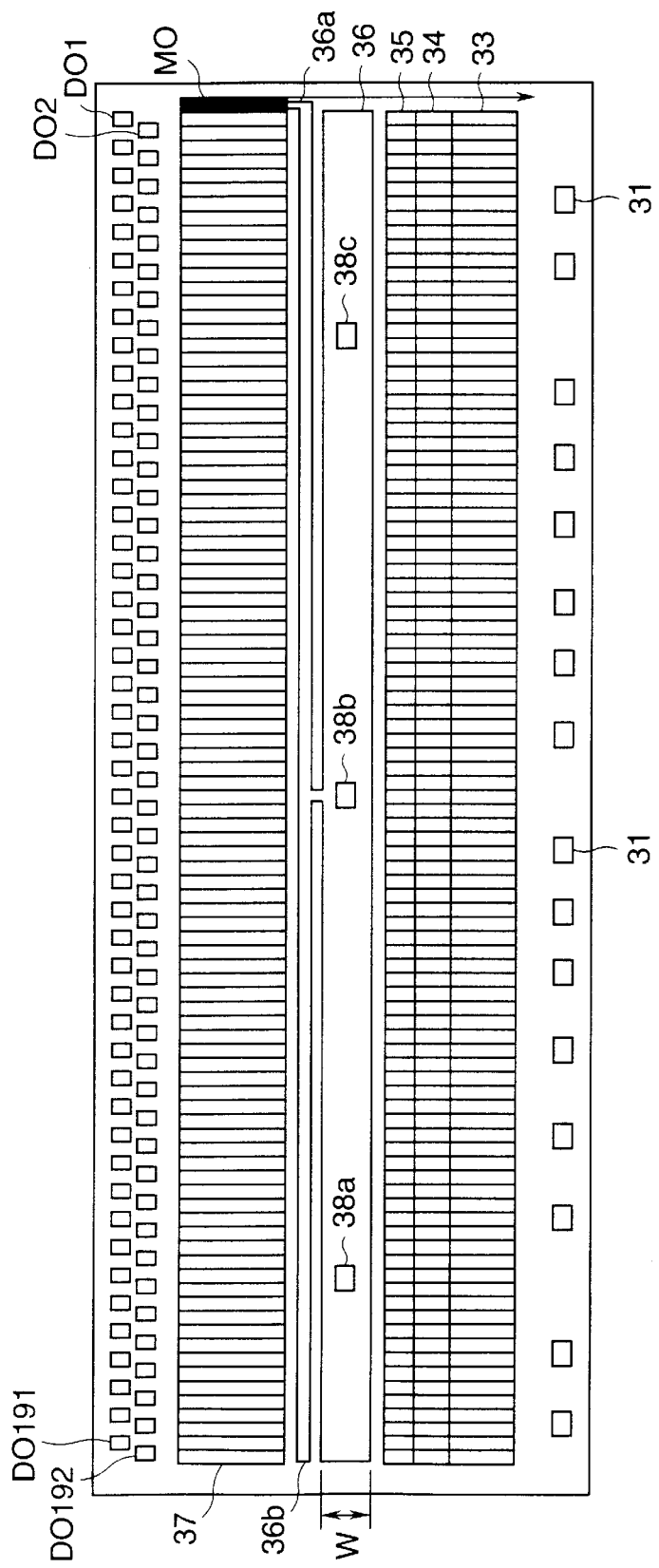
FIG. 10 illustrates the general layout of a driver IC and surrounding electrodes according to a third embodiment.

FIG. 10 illustrates the general layout of a driver IC mounted on a printed wiring board and surrounding electrodes formed on the board according to a third embodiment. Referring to FIG. 10, elements similar to those of the first embodiment have been given the same reference numerals and the description thereof is omitted.

The third embodiment differs from the first embodiment in that the reference transistor M0 is located at an end of the row of the drive transistors M1–M192 and receives its supply voltage from a substantially mid point of the LED supply voltage electrode 36. Two narrow patterns 36a and 36b branch from the LED supply voltage electrode 36 near a middle one of the electrode pads 38a–38c and extend in opposite directions along the LED supply voltage electrode 36. The pattern 36a is connected to the reference transistor M0, thereby supplying the supply voltage to the reference transistor M0.

The electrical equivalent circuit of FIG. 10 is the same as that of FIG. 3 and description thereof is omitted.

Referring to FIG. 10 and FIG. 3, the three electrode pads 38a, 38b, and 38c on the LED supply voltage electrode 36 are disposed near the electrode pads DO32, DO96, and DO160, respectively. Therefore, R201, R202, and R203 are connected to the sources of drive transistors M32, M96, and M160, respectively, i.e., the nodes S32, S96, and S160. The drains of the drive transistors M1–M192 are connected to the anodes of the LEDs D1–D192. The gates of the drive transistors M1–M192 are connected to a control voltage generating circuit, for example, shown in FIG. 4, which generates a gate-to-source voltage Vcont that sets the drive current Io that flows through each of the LEDs.

In the third embodiment, the reference transistor M0 receives its supply voltage directly from a longitudinally midway point of the driver IC chip. The effect of the voltage drop of the supply voltage along the LED supply voltage electrode 36 is symmetrical about the middle of the chip. Thus, the supply voltage for the reference transistor M0 is substantially an average value of supply voltages for other LEDs, thus controlling the drive currents for individual LEDs to be fairly close to the reference current.

As discussed in the first embodiment, the proportionality constant β and the threshold voltage Vt vary depending on locations along the row of the drive transistors.

The variation of the proportionality constant β and the threshold voltage Vt are sources of variation of the drive currents supplied from the driver IC. However, the supply voltage for the reference transistor, taken from the substantially mid point of the row of drive transistors fabricated in the chip, minimizes the variation of drive current.

Fourth Embodiment

Figure 11:
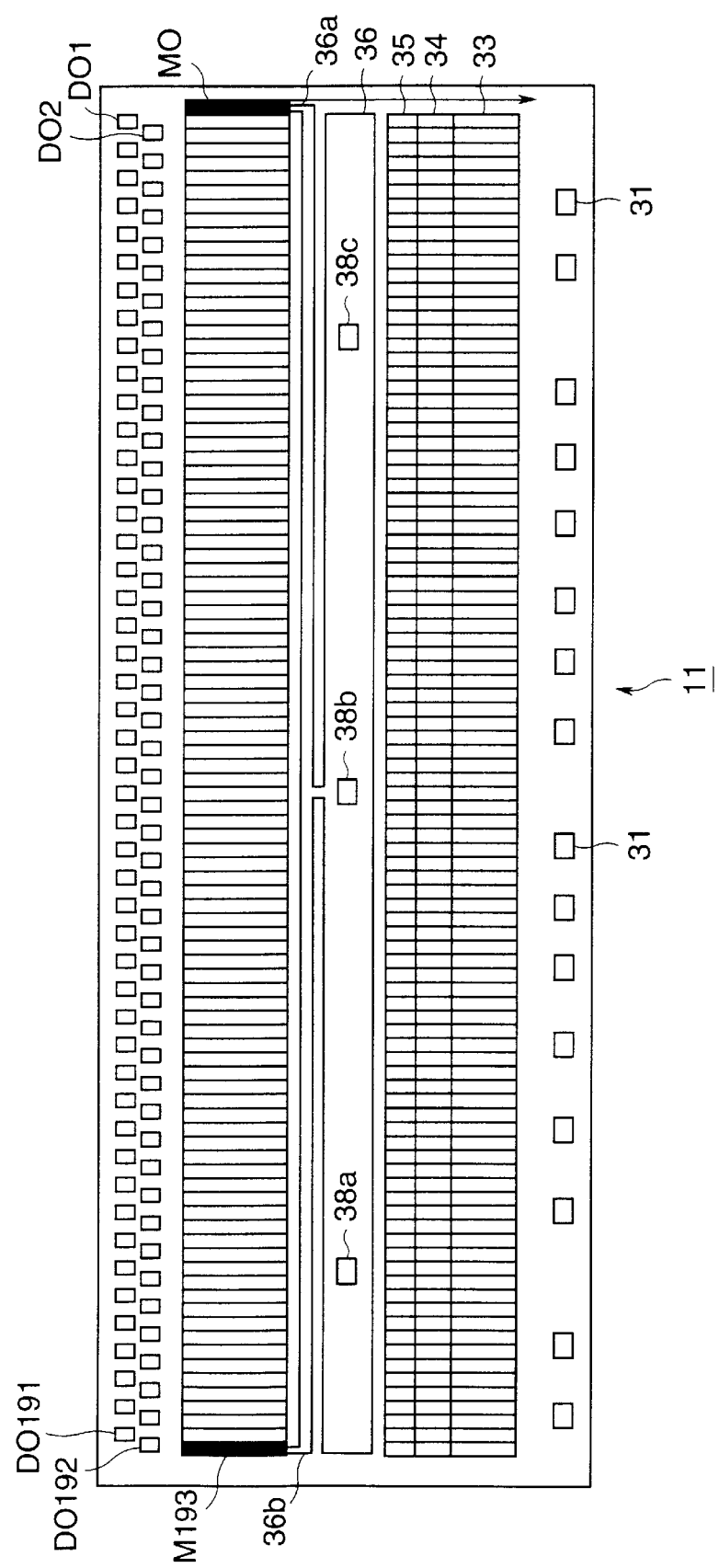
FIG. 11 illustrates the general layout of a driver IC and surrounded electrodes according to a fourth embodiment.

FIG. 11 illustrates the general layout of a driver IC mounted; on a printed wiring board and surrounding electrodes formed on the board according to a fourth embodiment. The fourth embodiment differs from the third embodiment in that two reference transistors M0 and M193 are used for generating a reference current Iref and arranged at longitudinal opposite ends of the chip of driver IC. In FIG. 11, these two reference transistors M0 and M193 are shown in solid black. Two narrow patterns 36a and 36b branch from the LED supply voltage electrode 36 near a middle one of the electrode pads 38a–38c and extend in opposite directions along the LED supply voltage electrode 36. The pattern 36a is connected to the reference transistor M0 and the pattern 36b is connected to the reference transistor M193, so that the two reference transistors M0 and M193 receive their supply voltages from the middle portion of the chip of driver IC.

Figure 12:
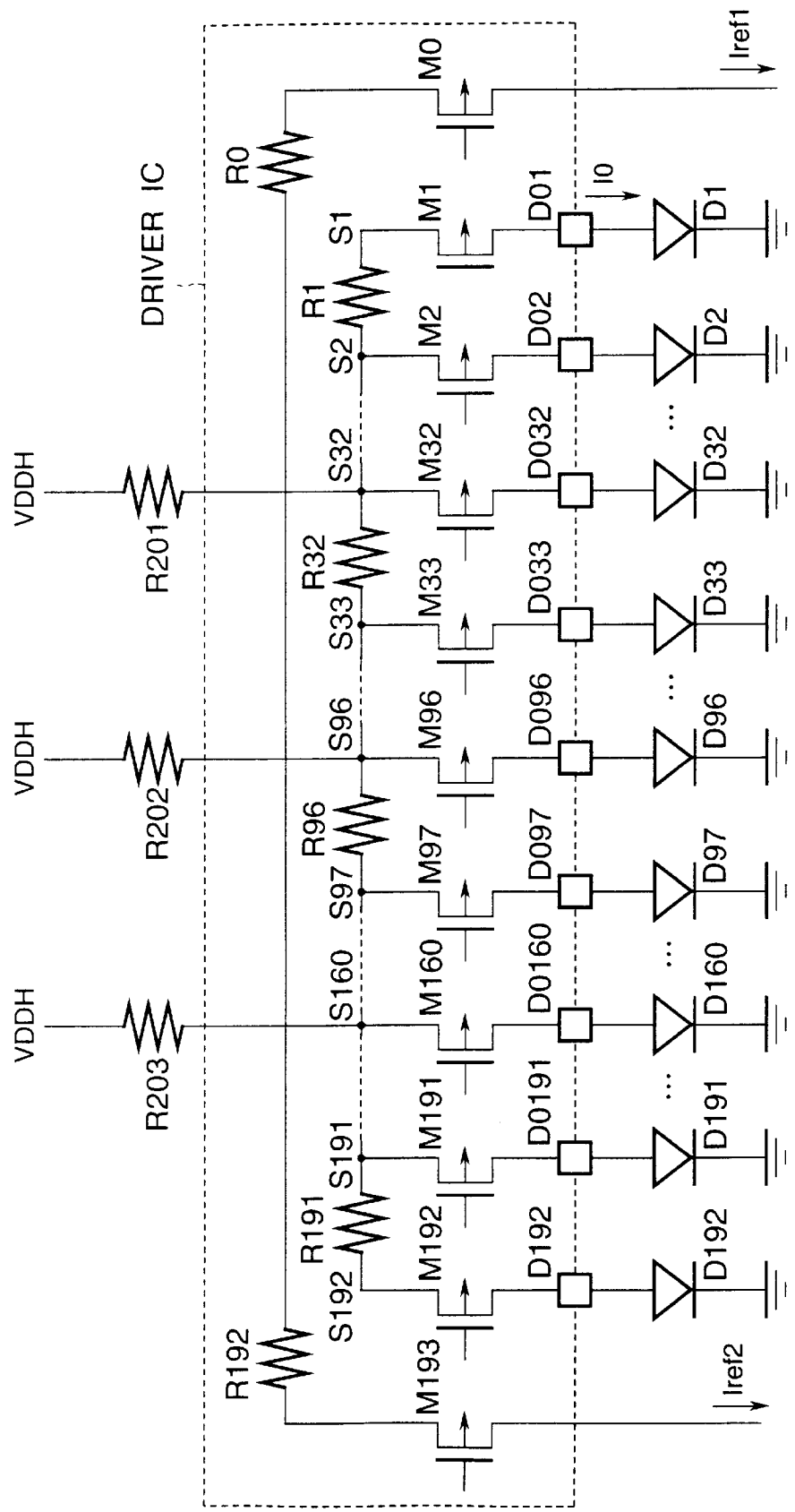
FIG. 12 illustrates a pertinent portion of an equivalent circuit of the LED array chip and driver IC of FIG. 11.

FIG. 12 illustrates an equivalent circuit of a pertinent portion of the LED array chip and driver IC (surrounded by dotted lines) of FIG. 11. Referring to FIG. 12, the sum of the drain currents Iref1 and Iref2 of the reference transistors M0 and M193, respectively, corresponds to the Iref of FIG. 7. The reference transistors M0 and M193 have the same gate length as those of the first embodiment but have a gate width that is half of that of the first embodiment. Thus, the reference current is given by Iref=Iref1+Iref2. For an ideal case where the reference transistors M1 and M193 are identical with each other, the current flowing the two transistors are equal, i.e., Iref1=Iref2=Iref/2. In other words, in the fourth embodiment, the reference current of a driver IC is the sum of the drain currents Iref1 and Iref2 of two reference transistors M0 and M193, respectively, arranged at opposite longitudinal ends. The gate-to-source voltage that determines the reference current Iref serves as a control voltage Vcont. The control voltage Vcont is also supplied to the gates of the drive transistors M1–M192, so that the drive transistors supply drive currents to their corresponding LEDs in reference to the reference current Iref.

The connection between the pre-buffer G1 and associated circuits according to the fourth embodiment is the same as that of the second embodiment of FIG. 8.

Figure 13:
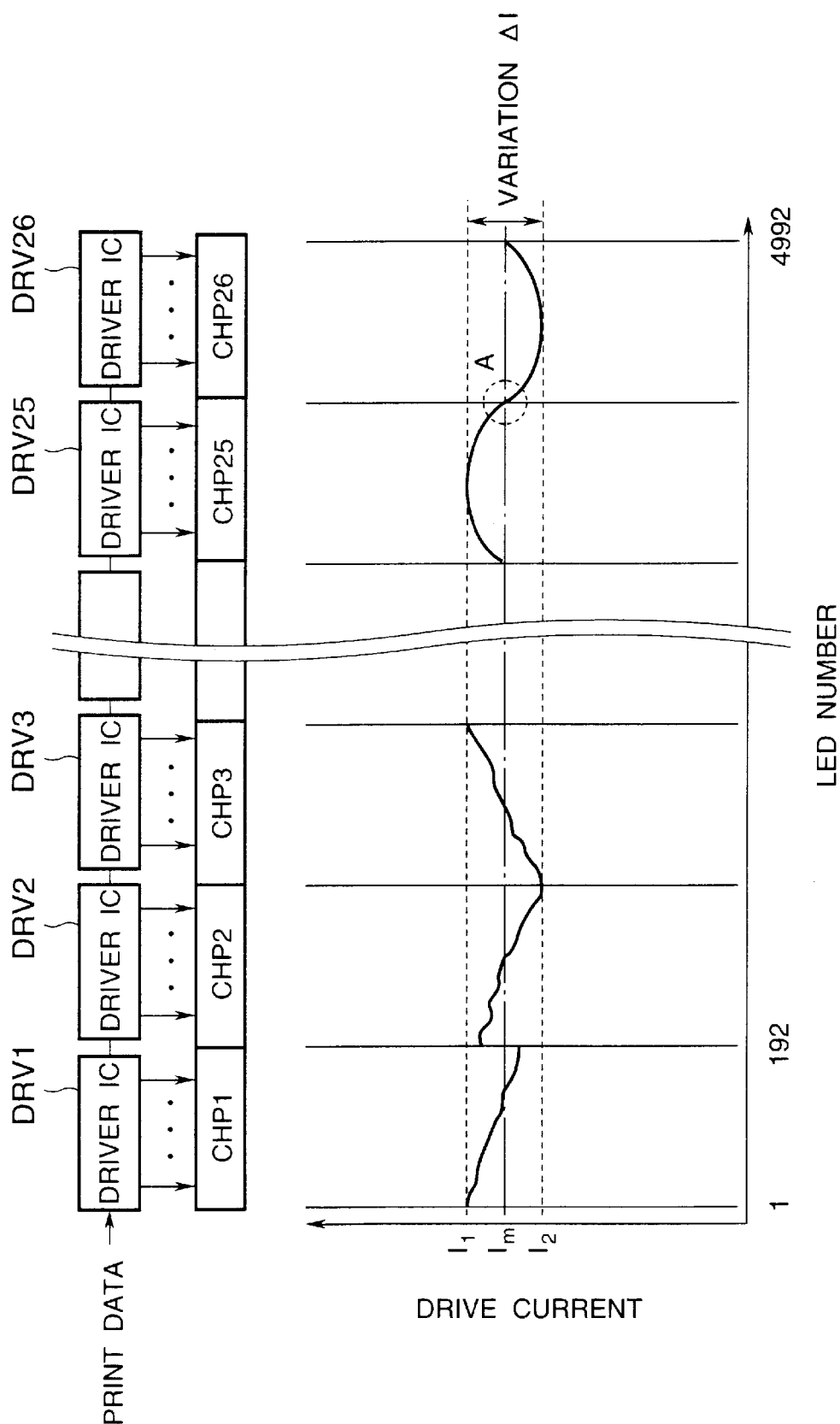
FIG. 13 illustrates LED array chips that are driven by driver ICs according to the fourth embodiment, and drive currents that flow through the LEDs fabricated in each of the LED array chips.

FIG. 13 illustrates LED array chips CHP1–CHP26 that are driven by driver ICs DRV1–DRV26 according to the fourth embodiment, and drive currents that flow through the LEDs fabricated in each of the LED array chips. The LED array chips CHP1–CHP26 are aligned in a direction parallel to the rotational axis of the photoconductive drum along the surface of the photoconductive drum.

The drive currents, supplied from the driver IC to the individual LEDs, are centered at the reference current Iref generated by the reference transistor and vary within the range of ΔI. The reference current Iref is substantially equal to an average value of the drain currents that flow through two reference transistors M0 and M193 arranged at two opposed longitudinal ends of the row of drive transistors. Accordingly, it can be assumed that a mean value Im of the drive currents that flow through the individual LEDs is substantially at the center of ΔI.

As shown in a dot-dash line in FIG. 13, the LEDs in each LED array chip have substantially the same mean value of drive currents as those in the other LED array chips. The variation of dot size reflects the variation of the drive current supplied by the driver IC that varies within the range ΔI. As a result, for the entire LED head, the fourth embodiment reduces the range of the variation of drive current by a factor of 2, i.e., from 2ΔI to ΔI as compared to the conventional driver circuit. Thus, it can be assumed that as shown by point A of FIG. 13, the drive current for the final LED of one of adjacent chips and the drive current for the first LED of the other of the adjacent chips have substantially the same or very close to each other.

Obtaining the supply voltage for the reference transistors from a substantially mid point of the row of drive transistors greatly reduces the problem encountered in the conventional driver circuit. For example, with the conventional driver circuit of FIG. 15, a first one of two halves of the row of drive transistors includes the reference transistor and a second one of the two halves of the row does not include the reference transistor. The first one of the two halves of the row drives a first one half of LEDs in an LED array chip, and the second one of the two halves of the row drives a second one half of the LEDs. If most LEDs in the first one half in the LED array chip are simultaneously energized while not so many LEDs in the second one half are simultaneously energized, then the first one of the two halves of the row of drive transistors is apt to supply less drive currents than the second one of the two halves. The fourth embodiment overcomes this problem.

Fifth Embodiment

Figure 14:
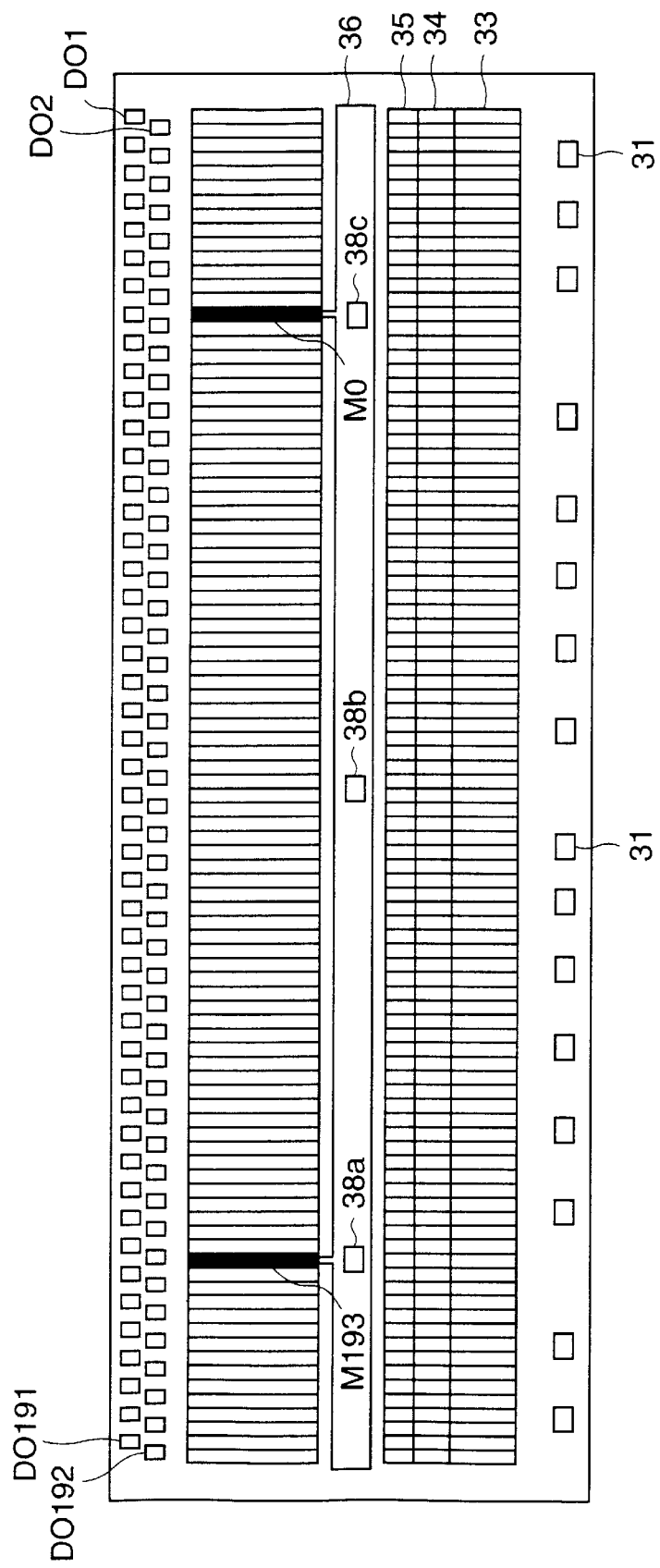
FIG. 14 illustrates the general layout of a driver IC and surrounding electrodes according to a fifth embodiment.

FIG. 14 illustrates the general layout of a driver IC mounted on a printed wiring board and surrounding electrodes formed on the board according to a fifth embodiment.

The fifth embodiment differs from the second embodiment in that the reference transistors are disposed in the row of the drive transistors such that the reference transistors M0 and M193 are mirror images of each other with respect to the longitudinal middle of the LED supply voltage electrode 36. The reference transistors M0 and M193 receive their supply voltage from the nearest locations on the LED supply voltage electrode 36, i.e., near the electrode pads 38a and 38c.

Figure 15:
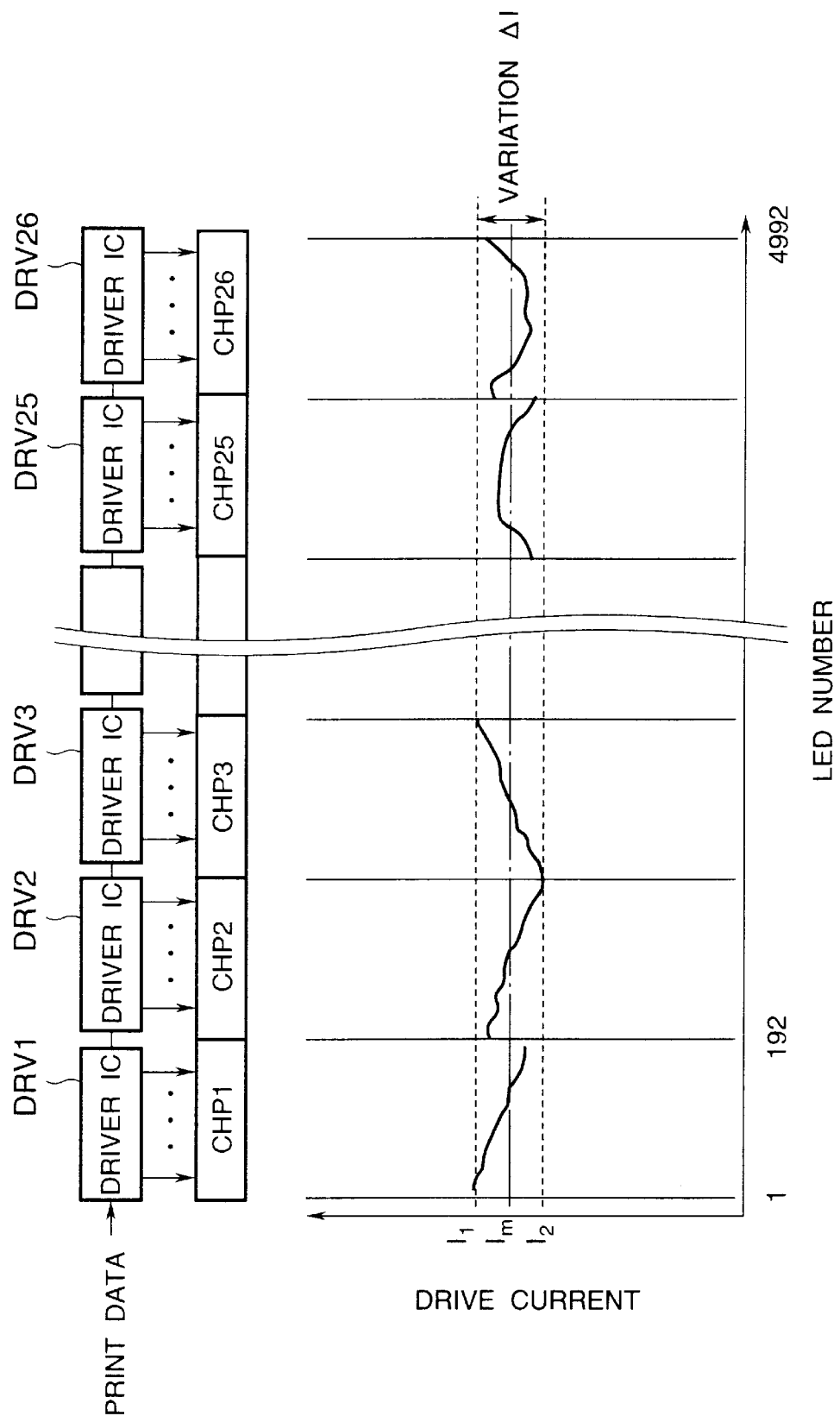
FIG. 15 illustrates LED array chips aligned along the surface of the photoconductive drum in a direction parallel to the rotational axis of the photoconductive drum, and drive currents Io flowing through the LEDs contained in each of the LED array chips.

FIG. 15 illustrates LED array chips CHP1–CHP26 that are driven by driver ICs DRV1–DRV26 according to the fifth embodiment, and drive currents that flow through the LEDs fabricated in each of the LED array chips.

It is to be noted that sum of the currents that flow through the reference transistors M0 and M193 is nearly in the middle of the variation ΔI. Thus, curves of each LED array chip crosses the mid point of the variation ΔI at two locations.

Figure 16:
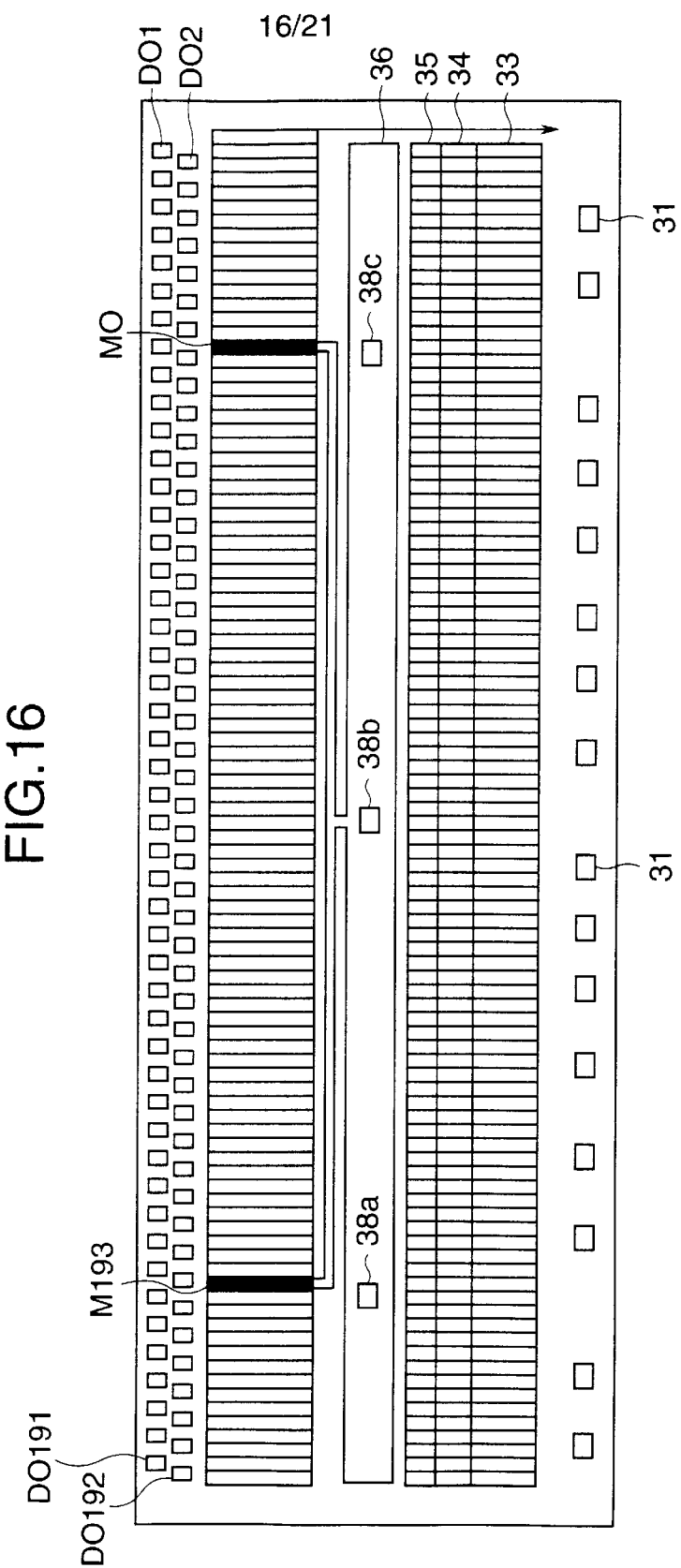
FIG. 16 is a modification of the fifth embodiment and illustrates a general layout of a driver IC and surrounding electrodes formed on a printed wiring board according to the modification.

FIG. 16 is a modification of the fifth embodiment and illustrates a general layout of a driver IC and surrounding electrodes formed on a printed wiring board according to the modification. It is to be noted that the reference transistors M0 and M193 receive their supply voltage from the middle of the LED supply voltage electrode 36. The distribution of drive currents are substantially the same as those shown in FIG. 15.

Although, the first to fifth embodiments have been described with respect to an LED head used in an electrophotographic printer, the invention may also applicable to heat-generating resistors for a thermal printer, and display elements for a display device.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A drive circuit, comprising:
   a row of drive devices that supply drive currents to corresponding elements;
   a control circuit having a reference current generating device that is generally aligned with said drive devices and generating a control voltage that causes a predetermined reference current to flow through the reference current generating device, the control voltage being supplied to the drive devices to cause the drive currents to flow through the corresponding elements in reference to the reference current; and
   a supply voltage electrode extending along said row, said supply voltage electrode supplying a supply voltage to said drive devices such that each of said drive devices receives the supply voltage from said supply voltage electrode,
   wherein said reference current generating device receives its supply voltage from a substantially mid point of the supply voltage electrode, and
   wherein said reference current generating device is substantially in the middle of said row of drive devices.

2. A drive circuit, comprising:
   a row of drive devices that supply drive currents to corresponding elements;
   a control circuit having a plurality of reference current generating devices that are generally aligned with said drive devices and cooperate with each other to produce a predetermined reference current, and generating a control voltage that controls the plurality of reference current generating devices to produce the predetermined reference current, the control voltage being supplied to the drive devices to cause the drive currents to flow through the corresponding elements in reference to the reference current; and
   a supply voltage electrode extending along said row, said supply voltage electrode supplying a supply voltage to said drive devices such that each of said drive devices receives the supply voltage from said supply voltage electrode,
   wherein the reference current is a sum of currents flowing through the plurality of reference current generating devices,
   wherein the plurality of reference current generating devices are disposed such that the reference current generating devices are mirror images of one another with respect to a substantially mid point of the row,
   wherein the plurality of reference current generating devices include two reference current generating devices, and
   wherein a first one of the two reference current generating devices is disposed at a first end of the row and a second one of the two reference current generating devices is disposed at a second end of the row opposite to the first end.

3. The drive circuit according to claim 2, wherein said row of drive devices, said control circuit, and said supply voltage electrode are formed in one semiconductor chip.

4. A drive circuit, comprising:
   a row of drive devices that supply drive currents to corresponding elements;
   a control circuit having a plurality of reference current generating devices that are generally aligned with said drive devices and cooperate with each other to produce a predetermined reference current, and generating a control voltage that controls the plurality of reference current generating devices to produce the predetermined reference current, the control voltage being supplied to the drive devices to cause the drive currents to flow through the corresponding elements in reference to the reference current; and
   a supply voltage electrode extending along said row, said supply voltage electrode supplying a supply voltage to said drive devices such that each of said drive devices receives the supply voltage from said supply voltage electrode;
   wherein the reference current is a sum of currents flowing through the plurality of reference current generating devices,
   wherein the plurality of reference current generating devices are disposed such that the reference current generating devices are mirror images of one another with respect to a substantially mid point of the row,
   wherein the plurality of reference current generating devices include two reference current generating devices, and
   wherein a first one of the two reference current generating devices is disposed at a first location within the row and a second one of the two reference current generating devices is disposed at a second location within the row.

5. The drive circuit according to claim 4, wherein said supply voltage electrode has two electrode pads mounted thereon through which said supply voltage electrode receives a main supply voltage from an external device, and the first location and the second location are substantially at the electrode pads in a direction in which said row extends.

6. A drive circuit, comprising:
   a row of drive devices that supply drive currents to corresponding elements;
   a control circuit having a reference current generating device that is generally aligned with said drive devices and generating a control voltage that causes a predetermined reference current to flow through the reference current generating device, the control voltage being supplied to the drive devices to cause the drive currents to flow through the corresponding elements in reference to the reference current;
   a first supply voltage electrode extending along said row, said first supply voltage electrode supplying a supply voltage to said drive devices such that each of said drive devices receives the supply voltage from said first supply voltage electrode; and
   a second supply voltage electrode branching from said first supply voltage electrode to supply a supply voltage to said reference current generating device,
   wherein said reference current generating device is one of at least two reference current generating devices,
   wherein said at least two reference current generating devices are disposed such that the reference current generating devices are mirror images of one another with respect to a substantially mid point of said second supply voltage electrode,
   wherein said second supply voltage electrode is one of a first sub electrode and a second sub electrode that branch from substantially a mid point of said first supply voltage electrode, and
   wherein each of the at least two reference current generating devices receives the supply voltage from one of the first sub electrode and the second sub electrode.

7. A light emitting diode type head for illuminating a charged photoconductive body to form an electrostatic latent image thereon, the head comprising:

a first row of light emitting diodes, said first row extending in a first direction;

a second row of drive devices that supply drive currents to corresponding light emitting diodes, said second row extending in a second direction that is substantially parallel to said first direction;

a control circuit having a reference current generating device and generating a control voltage that causes a predetermined reference current to flow through the reference current generating device, the control voltage being supplied to the drive devices to cause the drive currents to flow through the corresponding light emitting diodes in reference to the reference current; and a supply voltage electrode extending in a third direction that is substantially parallel to said second direction, said supply voltage electrode supplying a supply voltage to said drive devices such that each of said drive devices receives the supply voltage from said supply voltage electrode, wherein said reference current generating device is generally aligned with the drive devices and receives its supply voltage from a substantially mid point, in said third direction, of the supply voltage electrode.

8. A light emitting diode type head for illuminating a charged photoconductive body to form an electrostatic latent image thereon, the head comprising:

a first row of light emitting diodes;

a second row of drive devices that supply drive currents to corresponding light emitting diodes;

a control circuit having a plurality of reference current generating devices that cooperate with each other to produce a predetermined reference current, and generating a control voltage that controls the plurality of reference current generating devices to produce the predetermined reference current, the control voltage being supplied to the drive devices to cause the drive currents to flow through the corresponding elements in reference to the reference current; and a supply voltage electrode extending in a direction substantially parallel to said second row, said supply voltage electrode supplying a supply voltage to said drive devices such that each of said drive devices receives the supply voltage from said supply voltage electrode, wherein the plurality of reference current generating devices are generally aligned with the drive devices and are disposed at positions that are mirror images of one another with respect to substantially a mid point of the second row, the plurality of reference current generating devices including a first reference current generating device disposed at a first end of the second row and a second reference current generating device disposed at a second end of the second row, and wherein the reference current is a sum of currents flowing through the plurality of reference current generating devices.

9. A drive circuit for driving a plurality of elements that are disposed in a row, comprising:

a plurality of drive devices, each of which supplies a drive current to a corresponding one of said elements, said drive devices being disposed in a row which extends in a first direction;

a control circuit having a reference current generating device and generating a control voltage that causes a predetermined reference current to flow through the reference current generating device, the control voltage being supplied to the drive devices to cause the drive currents to flow through the corresponding elements in reference to the reference current; and a supply voltage electrode extending in a second direction generally parallel to said first direction, said supply voltage electrode supplying a supply voltage to the drive devices such that each of the drive devices receives the supply voltage from said supply voltage electrode, wherein said reference current generating device is generally aligned with the drive devices and receives its supply voltage from a substantially mid point, in the third direction, of the supply voltage electrode.

10. The drive circuit according to claim 9, wherein said reference current generating device is disposed at an end of said row of drive devices.

11. The drive circuit according to claim 9, wherein said row of drive devices, said control circuit, and said supply voltage electrode are formed in one semiconductor chip.

12. A drive circuit, comprising:

a row of drive devices that supply drive currents to corresponding elements;

a control circuit having a reference current generating device that is generally aligned with the drive devices, the control circuit generating a control voltage that causes a predetermined reference current to flow through the reference current generating device, the control voltage being supplied to the drive devices to cause the drive currents to flow through the corresponding elements in reference to the reference current;

a first supply voltage electrode extending in a first direction substantially parallel to said row, said first supply voltage electrode supplying a supply voltage to the drive devices such that each of the drive devices receives the supply voltage from said first supply voltage electrode; and a second supply voltage electrode branching from a substantially mid point in the first direction of said first supply voltage electrode and extending in a second direction substantially parallel to the first direction, said second supply voltage electrode supplying a supply voltage to said reference current generating device.

13. The drive circuit according to claim 12, wherein said second supply voltage electrode has a first end and a second end, the first end being connected to said first supply voltage electrode, the second end being connected to said reference current generating device.

14. The drive circuit according to claim 12, wherein said reference current generating device is a first reference current generating device, and further comprising at least one second reference current generating device, wherein said reference current generating devices are disposed such that the reference current generating devices are symmetrically positioned with respect to a substantially mid point of said second supply voltage electrode.

15. The drive circuit according to claim 12, wherein said row of drive devices, said control circuit, and said supply voltage electrode are formed in one semiconductor chip.

* * * * *